(12) United States Patent  
Padmanabhan et al.

(10) Patent No.: US 9,620,443 B2  
(45) Date of Patent: Apr. 11, 2017

(54) SEMICONDUCTOR COMPONENT AND METHOD OF MANUFACTURE

(71) Applicant: Semiconductor Components Industries, LLC, Phoenix, AZ (US)

(72) Inventors: Balaji Padmanabhan, Tempe, AZ (US); Prasad Venkatraman, Gilbert, AZ (US); Ali Salih, Mesa, AZ (US); Chun-Li Liu, Scottsdale, AZ (US); Phillip Celaya, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/208,703

(22) Filed: Jul. 13, 2016

(65) Prior Publication Data

US 2017/0025340 A1 Jan. 26, 2017

Related U.S. Application Data

(60) Provisional application No. 62/196,642, filed on Jul. 24, 2015.

(51) Int. Cl.  
*H01L 23/495* (2006.01)  
*H01L 23/31* (2006.01)  
(Continued)

(52) U.S. Cl.  
CPC .... *H01L 23/49575* (2013.01); *H01L 21/4825* (2013.01); *H01L 21/4882* (2013.01); *H01L 21/565* (2013.01); *H01L 23/3114* (2013.01); *H01L 23/4951* (2013.01); *H01L 23/4952* (2013.01); *H01L 23/49548* (2013.01); *H01L 23/49562* (2013.01); *H01L 23/49568* (2013.01)

(58) Field of Classification Search  
CPC .......... H01L 23/49575; H01L 23/3114; H01L 23/4951; H01L 23/4952; H01L 23/49548; H01L 23/49562; H01L 23/49568; H01L 21/4825; H01L 21/565  
USPC ........................................................ 257/675  
See application file for complete search history.

(56) References Cited

U.S. PATENT DOCUMENTS 7,745,913 B2   6/2010 Hosseini et al.  
8,455,987 B1 * 6/2013 Spann ..................... H01L 21/56  
257/675

(Continued)

*Primary Examiner* — Nathan W Ha  
(74) *Attorney, Agent, or Firm* — Rennie William Dover

(57) ABSTRACT

In accordance with an embodiment, a semiconductor component includes a support having a first device receiving structure, a second device receiving structure, a first lead and a second lead. A first semiconductor chip is coupled to the first device receiving structure and a second semiconductor chip is coupled to the first semiconductor chip and the second device receiving structure. The first semiconductor chip is configured from a silicon semiconductor material and has a gate bond pad, a source bond pad, and a drain bond pad, and the second semiconductor chip is configured from a gallium nitride semiconductor chip and has a gate bond pad, a source bond pad, and a drain bond pad. In accordance with another embodiment, a method for manufacturing a semiconductor component includes coupling a first semiconductor chip to a support and coupling a second semiconductor chip to the support.

20 Claims, 24 Drawing Sheets

(51) Int. Cl.
*H01L 21/48* (2006.01)
*H01L 21/56* (2006.01)

(56) References Cited

U.S. PATENT DOCUMENTS

| | | | |
|---|---|---|---|
| 2007/0249092 A1* | 10/2007 | Joshi | H01L 23/492 |
| | | | 438/107 |
| 2008/0164590 A1* | 7/2008 | Xiaochun | H01L 23/49524 |
| | | | 257/675 |
| 2010/0232131 A1* | 9/2010 | Qian | H01L 23/49524 |
| | | | 361/813 |
| 2011/0133251 A1 | 6/2011 | He | |
| 2012/0223321 A1* | 9/2012 | Lin | H01L 25/074 |
| | | | 257/76 |
| 2012/0223322 A1 | 9/2012 | Lin et al. | |
| 2013/0069208 A1 | 3/2013 | Briere | |
| 2013/0088280 A1 | 4/2013 | Lal et al. | |
| 2013/0175704 A1 | 7/2013 | Jeun | |
| 2013/0256856 A1* | 10/2013 | Mahler | H01L 24/40 |
| | | | 257/676 |
| 2014/0103510 A1* | 4/2014 | Andou | H01L 23/49551 |
| | | | 257/676 |
| 2014/0197525 A1* | 7/2014 | Kadoguchi | H01L 21/565 |
| | | | 257/666 |
| 2014/0239472 A1* | 8/2014 | Jones | H01L 24/49 |
| | | | 257/676 |
| 2014/0361419 A1* | 12/2014 | Xue | H01L 23/492 |
| | | | 257/676 |
| 2015/0145112 A1* | 5/2015 | Otremba | H01L 23/49541 |
| | | | 257/676 |
| 2016/0211246 A1 | 7/2016 | Akiyama et al. | |

* cited by examiner

SEMICONDUCTOR COMPONENT AND METHOD OF MANUFACTURE

The present application is a nonprovisional application of Provisional Patent Application No. 62/196,642 filed on Jul. 24, 2015, by Balaji Padmanabhan et al., titled "SEMICONDUCTOR COMPONENT AND METHOD OF MANUFACTURE", which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, semiconductor manufacturers have used a combination of silicon semiconductor materials and III-N semiconductor materials to manufacture cascoded devices, such as a normally-on III-N depletion mode HEMT cascoded with a silicon device. Using this combination of materials helps achieve a normally-off state using a III-N depletion mode device that is normally-on. Cascoded semiconductor devices have been described in U.S. Patent Application Publication Number 2013/0088280 A1 by Rakesh K. Lal et al. and published on Apr. 11, 2013.

After manufacturing cascoded devices from different semiconductor substrate materials, semiconductor component manufacturers typically protect the silicon device and the depletion mode devices in separate packages and connect the devices in the separate packages together via leadframe leads to form a cascoded device. A drawback with this approach is that increasing the number of packages increases the cost of a cascoded semiconductor component and degrades the performance of the cascoded devices because of increased parasitics such as parasitic capacitance and parasitic inductance.

Accordingly, it would be advantageous to have a cascoded semiconductor device and a method for manufacturing the cascoded semiconductor device. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
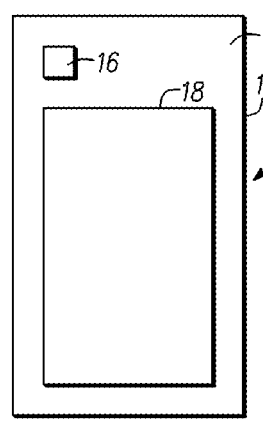
FIG. 1 is a top view of a semiconductor chip suitable for use in manufacturing a cascode configured semiconductor component in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

FIG. 1 is a top view of a semiconductor chip 10 suitable for use in manufacturing a semiconductor component in accordance with an embodiment of the present invention. Semiconductor chip 10 has a top surface 12 and a bottom surface 14 (shown in at least FIG. 7). In accordance with an embodiment, semiconductor chip 10 is a silicon chip that may include a vertical field effect semiconductor device 11 having a gate bond pad 16 formed on or from surface 12, a source bond pad 18 formed on or from surface 14, and a drain electrode 20 (shown in at least FIG. 7) formed on or from surface 14. It should be noted that semiconductor device 11 is not limited to being a vertical field effect transistor or a field effect transistor. For example, semiconductor device 11 may be an insulated gate bipolar transistor, a bipolar transistor, a junction field effect transistor, a diode, lateral field effect transistor or the like. By way of example, semiconductor chip 10 is a silicon semiconductor chip, i.e., the substrate material of silicon semiconductor chip 10 comprises silicon. A silicon semiconductor material may be referred to as silicon based semiconductor material, a silicon semiconductor material, or the like. A semiconductor chip such as, for example semiconductor chip 10 may be referred to as a semiconductor die.

Figure 2:
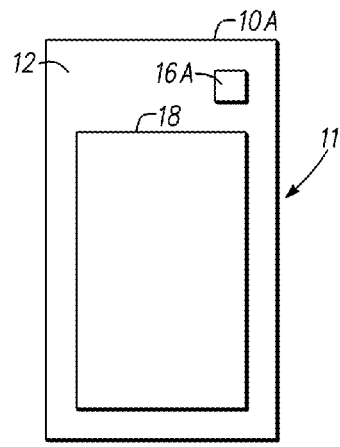
FIG. 2 is a top view of a semiconductor chip suitable for use in manufacturing a cascode configured semiconductor component in accordance with an embodiment of the present invention.

FIG. 2 is a top view of a semiconductor chip 10A suitable for use in manufacturing a semiconductor component in accordance with an embodiment of the present invention. Semiconductor chip 10A has a top surface 12 and a bottom surface 14 (shown in at least FIGS. 40 and 41). In accordance with an embodiment, semiconductor chip 10A is a silicon chip that may include a vertical field effect semiconductor device 11 having a gate bond pad 16A formed on or from surface 12, a source bond pad 18 formed on or from surface 14, and a drain electrode 20 (shown in at least FIGS. 40 and 41) formed on or from surface 14. It should be noted that semiconductor device 11 is not limited to being a vertical field effect transistor or a field effect transistor. For example, semiconductor device 11 may be an insulated gate bipolar transistor, a bipolar transistor, a junction field effect transistor, a diode, lateral field effect transistor or the like. By way of example, semiconductor chip 10A is a silicon semiconductor chip, i.e., the substrate material of silicon semiconductor chip 10A comprises silicon. A silicon semiconductor material may be referred to as silicon based semiconductor material, a silicon semiconductor material, or the like. A semiconductor chip such as, for example semiconductor chip 10A may be referred to as a semiconductor die.

Figure 3:
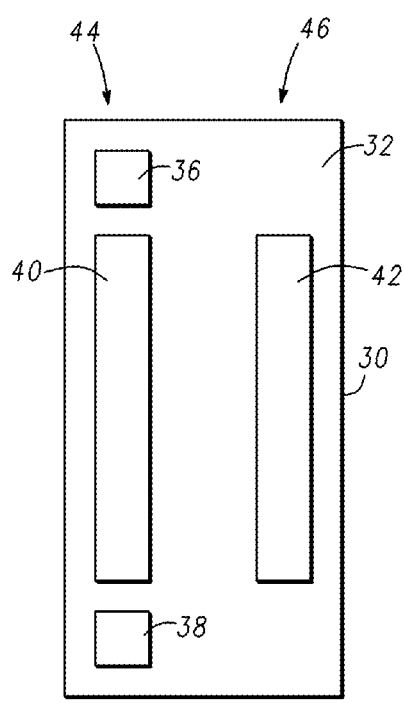
FIG. 3 is a top view of a semiconductor chip suitable for use in manufacturing a cascode configured semiconductor component in accordance with an embodiment of the present invention.

FIG. 3 is a top view of a semiconductor chip 30 suitable for use in manufacturing a semiconductor component in accordance with another embodiment of the present invention. Semiconductor chip 30 has a top surface 32 and a bottom surface 34 (shown in at least FIG. 7-10), wherein gate bond pads 36 and 38 are formed on or from top surface 32, a source bond pad 40 is formed on or from top surface 32, and a drain bond pad 42 (shown in at least FIGS. 7-10) is formed on or from top surface 32. Source bond pad 40 is formed between gate bond pads 36 and 38 and on a side 44 of semiconductor chip 30 whereas drain bond pad 42 is formed on a side 46 of semiconductor chip 30. Sides 44 and 46 are on opposite sides of semiconductor chip 30. It should be noted that gate bond pads 36 and 38 are electrically connected together through the substrate material of semiconductor chip 30. Semiconductor chip 30 is fabricated from a compound semiconductor material such as, for example, a III-nitride semiconductor material. Thus, semiconductor chip 30 may be referred to as a III-nitride semiconductor chip, i.e., the substrate material of III-nitride semiconductor chip 30 comprises a III-nitride material such as, for example, aluminum nitride, gallium nitride, or the like. A III-nitride semiconductor material may be referred to as a III-N semiconductor material, a III-nitride based semiconductor material, a III-N based semiconductor material, or the like. A semiconductor chip such as, for example, semiconductor chip 30 may be referred to as a semiconductor die. The substrate of the III-N semiconductor chip 30 can also be made of silicon.

Figure 4:
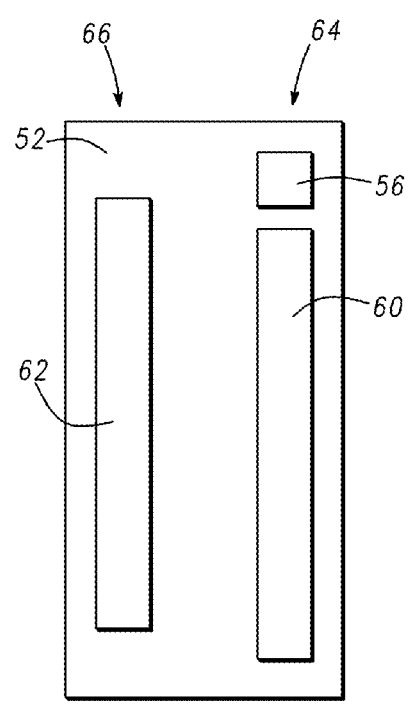
FIG. 4 is a top view of a semiconductor chip suitable for use in manufacturing a cascode configured semiconductor component in accordance with an embodiment of the present invention.

FIG. 4 is a top view of a semiconductor chip 50 suitable for use in manufacturing a semiconductor component in accordance with another embodiment of the present invention. Semiconductor chip 50 has a top surface 52 and a bottom surface 54 (shown in at least FIGS. 20 and 21), wherein a gate bond pad 56 is formed on or from a portion of top surface 52, a source bond pad 60 is formed on or from another portion of top surface 52, and a drain bond pad 62 (shown in at least FIGS. 20 and 21) is formed on or from yet another portion of top surface 52. Gate bond pad 56 and source bond pad 60 are formed on a side 64 of semiconductor chip 50 whereas drain bond pad 62 is formed on a side 66 of semiconductor chip 50. Sides 64 and 66 are on opposite sides of semiconductor chip 50. Semiconductor chip 50 is fabricated from a compound semiconductor material such as, for example, a III-nitride semiconductor material. Thus, semiconductor chip 50 may be referred to as a III-nitride semiconductor chip, i.e., the substrate material of III-nitride semiconductor chip 50 comprises a III-nitride material such as, for example, aluminum nitride, gallium nitride, or the like. A III-nitride semiconductor material may be referred to as a III-N semiconductor material, a III-nitride based semiconductor material, a III-N based semiconductor material, or the like. A semiconductor chip such as, for example semiconductor chip 50 may be referred to as a semiconductor die. The substrate of the III-N semiconductor chip 50 can also be made of silicon.

The source and the drain pad 62 and 60 may be formed over active area of the semiconductor chip 50 in accordance with another embodiment of the present invention. This may be referred to as Bond Over Active ("BOA") configuration.

Figure 5:
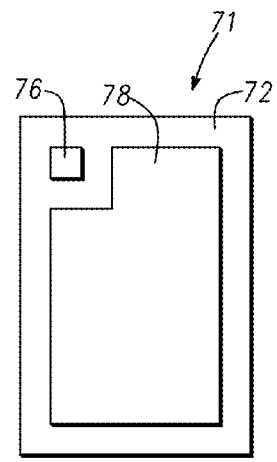
FIG. 5 is a top view of a semiconductor chip suitable for use in manufacturing a cascode configured semiconductor component in accordance with an embodiment of the present invention.

FIG. 5 is a top view of a semiconductor chip 70 suitable for use in manufacturing a semiconductor component in accordance with another embodiment of the present invention. Semiconductor chip 70 has a top surface 72 and a bottom surface. In accordance with an embodiment, semiconductor chip 70 is a silicon chip that may include a vertical field effect semiconductor device 71 having a gate bond pad 76 formed on or from top surface 72, a source bond pad 78 formed on or from top surface 72, and a drain bond pad formed on or from the bottom surface. It should be noted that semiconductor device 71 is not limited to being a vertical field effect transistor or a field effect transistor. For example, semiconductor device 71 may be an insulated gate bipolar transistor, a bipolar transistor, a junction field effect transistor, a diode, a lateral field effect transistor or the like. By way of example, semiconductor chip 70 is a silicon semiconductor chip, i.e., the substrate material of silicon semiconductor chip 70 comprises silicon. A silicon semiconductor material may be referred to as silicon based semiconductor material, a silicon semiconductor material, or the like. A semiconductor chip such as, for example semiconductor chip 70 may be referred to as a semiconductor die.

Figure 6:
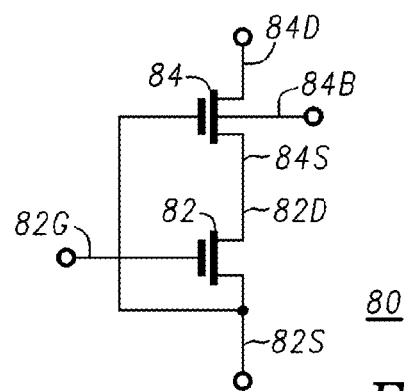
FIG. 6 is a circuit schematic of a semiconductor component in a cascode configuration, wherein a substrate of a III-N semiconductor device is floating.

FIG. 6 is a circuit schematic 80 of a semiconductor component in a cascode configuration. The semiconductor component includes transistors 82 and 84, where transistor 82 has a gate electrode 82G, a source electrode 82S, and a drain electrode 82D and transistor 84 has a gate electrode 84G, a source electrode 84S, a drain electrode 84D, and a body/substrate terminal 84B. Drain electrode 82D is electrically connected to source electrode 84S and source electrode 82S is electrically connected to gate electrode 84G. Drain electrode 84D may be coupled for receiving a first source of operating potential such as, for example, a potential $V_{DD}$, for cascode semiconductor component 80, gate electrode 82G serves as an input terminal for cascoded semiconductor component 80, and source electrode 82S is coupled for receiving a second source of operating potential such as, for example potential $V_{SS}$. By way of example, potential $V_{SS}$ is ground. It should be noted that the substrate of III-N transistor 84 is floating, thus semiconductor component 80 may be referred to as being in a floating configuration or substrate floating configuration.

Figure 7:
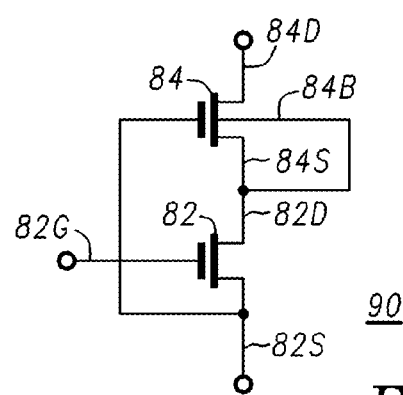
FIG. 7 is a circuit schematic of a semiconductor component in a cascode configuration, wherein a substrate of a III-N semiconductor device is coupled to its source electrode.

FIG. 7 is a circuit schematic 90 of a semiconductor component in a cascode configuration. The semiconductor component includes transistors 82 and 84, where transistor 82 has a gate electrode 82G, a source electrode 82S, and a drain electrode 82D and transistor 84 has a gate electrode 84G, a source electrode 84S, a drain electrode 84D, and a body/substrate terminal 84B. Drain electrode 82D is electrically connected to source electrode 84S and source electrode 82S is electrically connected to gate electrode 84G. Drain electrode 84D may be coupled for receiving a first source of operating potential such as, for example, potential $V_{DD}$, for cascode semiconductor component 80, gate electrode 82G serves as an input terminal for cascoded semiconductor component 80, and source electrode 82S is coupled for receiving a second source of operating potential such as, for example, a potential $V_{SS}$. By way of example, potential $V_{SS}$ is a ground potential. Substrate terminal 84B of transistor 84 is electrically connected to source electrode 84S of transistor 84 and to the drain electrode of transistor 84. Thus, the substrate of transistor 84 is coupled to the same potential as source electrode 84S of transistor 84 or drain electrode 82D of transistor 82.

Figure 8:
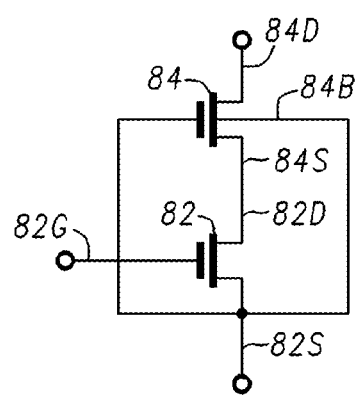
FIG. 8 is a circuit schematic of a semiconductor component in a cascode configuration, wherein a substrate of a III-N semiconductor device is coupled to a source electrode of a silicon semiconductor device.

FIG. 8 is a circuit schematic 97 of a semiconductor component in a cascode configuration. The semiconductor component includes transistors 82 and 84, where transistor 82 has a gate electrode 82G, a source electrode 82S, and a drain electrode 82D and transistor 84 has a gate electrode 84G, a source electrode 84S, a drain electrode 84D, and a body/substrate terminal 84B. Drain electrode 82D of transistor 82 is electrically connected to source electrode 84S of transistor 84 and source electrode 82S of transistor 82 is electrically connected to gate electrode 84G of transistor 84. Drain electrode 84D may be coupled for receiving a first source of operating potential such as, for example potential $V_{DD}$, for cascode semiconductor component 80, gate electrode 82G serves as an input terminal for cascoded semiconductor component 80, and source electrode 82S is coupled for receiving a second source of operating potential such as for example potential $V_{SS}$. By way of example potential $V_{SS}$ is a ground potential. Substrate terminal 84B of transistor 84 is electrically connected to source electrode 82S of transistor 82. Thus, the substrate of transistor 84 is coupled to the same potential as source electrode 82S of transistor 82.

Figure 9:
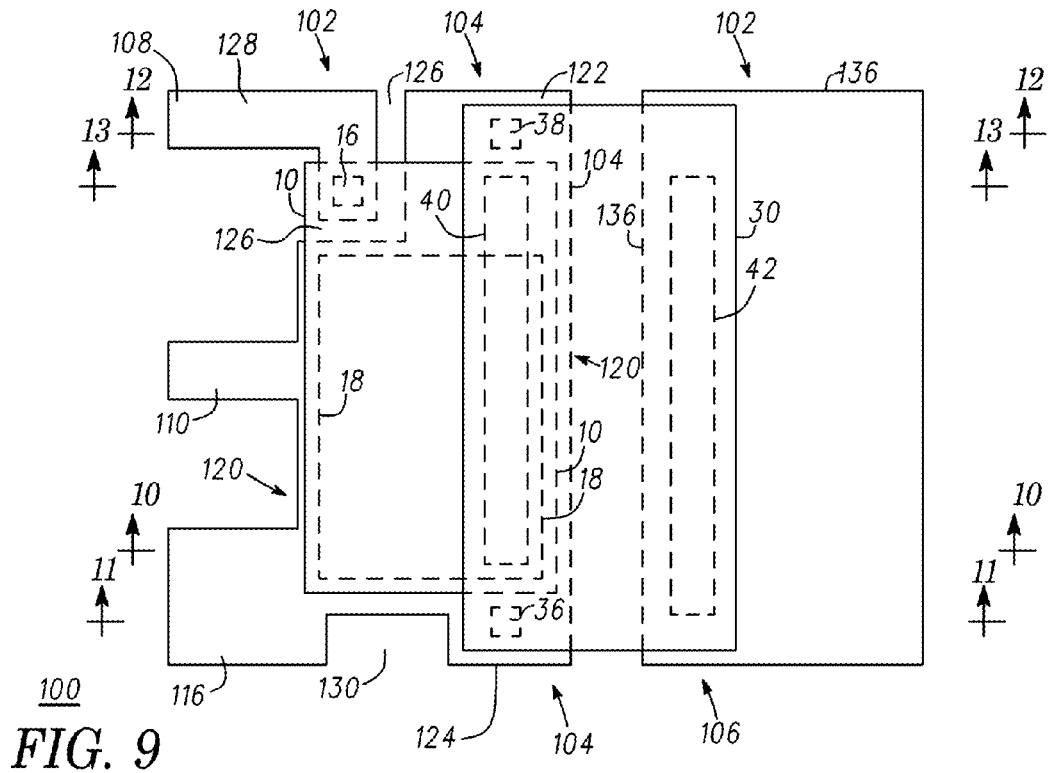
FIG. 9 is a top view of a cascode configured semiconductor component in accordance with an embodiment of the present invention.
Figure 10:
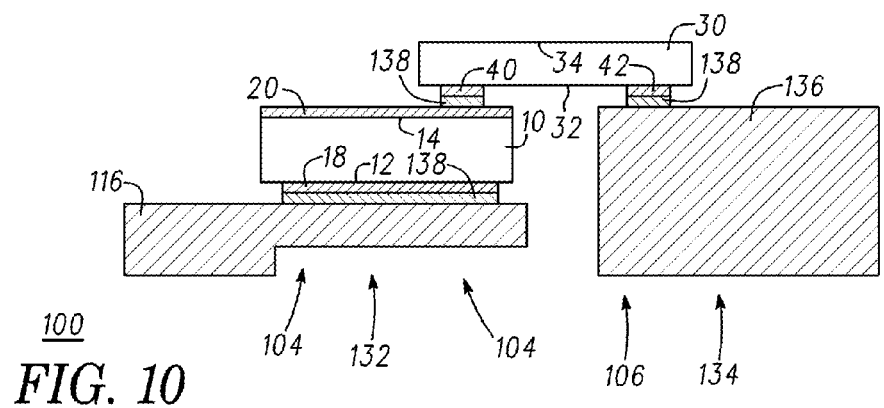
FIG. 10 is a cross-sectional view of the cascode configured semiconductor component of FIG. 9 taken along section line 10-10 of FIG. 9.
Figure 11:
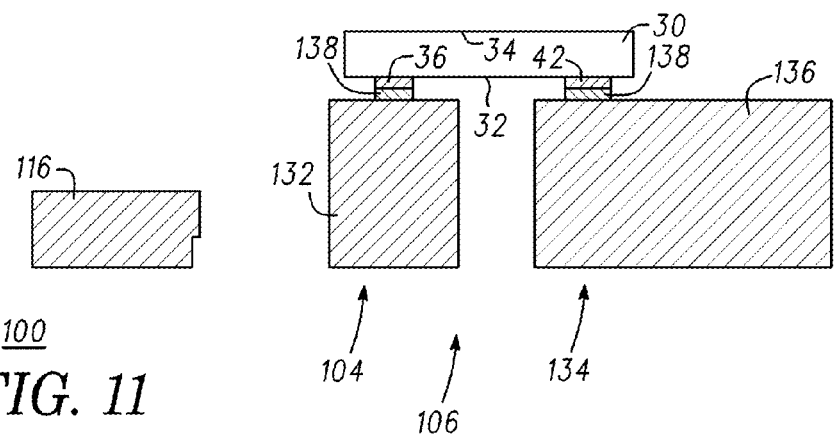
FIG. 11 is a cross-sectional view of the cascode configured semiconductor component of FIG. 9 taken along section line 11-11 of FIG. 9.
Figure 12:
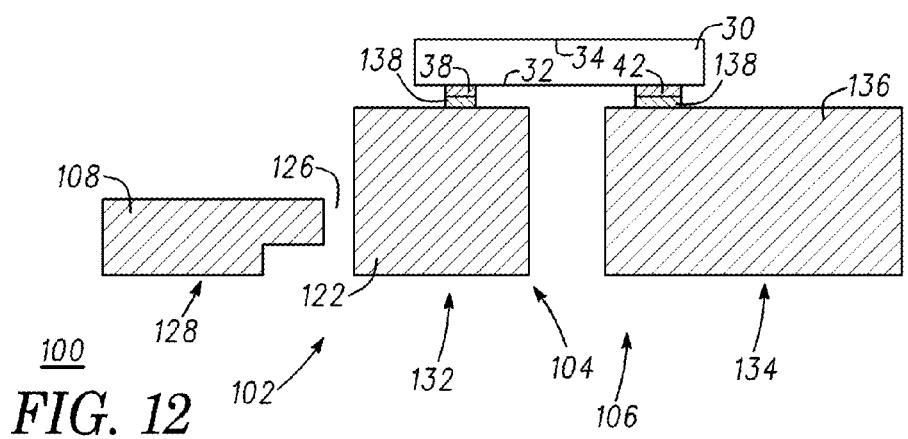
FIG. 12 is a cross-sectional view of the cascode configured semiconductor component of FIG. 9 taken along section line 12-12 of FIG. 9.
Figure 13:
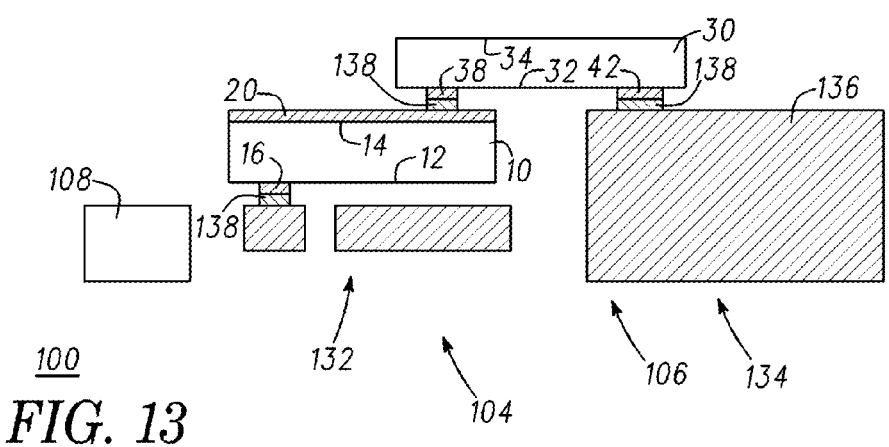
FIG. 13 is a cross-sectional view of the cascode configured semiconductor component of FIG. 9 taken along section line 13-13 of FIG. 9.

FIG. 9 is a top view of a semiconductor component 100 comprising a support 102 to which a semiconductor chip 10 and a semiconductor chip 30 are mounted. FIG. 10 is a cross-sectional view of semiconductor component 100 taken along section line 10-10 of FIG. 9, FIG. 11 is a cross-sectional view of semiconductor component 100 taken along section line 11-11 of FIG. 9, FIG. 12 is a cross-sectional view of semiconductor component 100 taken along section line 12-12 of FIG. 9, and FIG. 13 is a cross-sectional view of semiconductor component 100 taken along section line 13-13 of FIG. 9. For the sake of clarity, FIGS. 9-13 are described together. Support 102 includes device receiving structures 104 and 106, a gate lead 108, a Kelvin lead 110, a source lead 116, and is configured for packaging in a QFN package. Device receiving structure 104 includes a rectangularly shaped portion 120 having tabs 122 and 124 extending from opposing sides of rectangularly shaped portion 120. Thus, rectangularly shaped portion 120 and tabs 122 and 124 form a T-shape. Tab 122 and rectangularly shaped portion 120 are configured to form a notch 126. A contact interconnect 128 having an L-shape is formed in notch 126, wherein contact interconnect 128 is electrically isolated from rectangularly shaped portion 120 and tab 122. In accordance with an embodiment contact interconnect 128 has a leg portion and a foot portion that may be at right angles to each other. The foot portion is configured to mate with a gate bond pad 16 and the leg portion has an end region that serves as gate lead 108 or a gate post. Kelvin lead 110 has a rectangular shape and is integral with and extends from rectangularly shaped portion 120. Source lead 116 is a rectangularly shaped electrically conductive material having a portion that is integral with and extends from a corner region of rectangularly shaped portion 120 that is opposite the corner from which tab 124 extends. A notch 130 is formed in a portion of support 102 that is between source lead 116 and tab 124. Kelvin lead 110 may be referred to as a Kelvin post and source lead 116 may be referred to as a source post. Device receiving structure 106 includes a body of electrically conductive material 136 that is spaced apart and electrically isolated from rectangularly shaped portion 120, tab 122, and tab 124. Tabs 122 and 124 are common to device receiving structure 106 and device receiving structure 104, tabs 122 and 124 are shared by device receiving structures 106 and 104. Although leads 108, 110, and 116 have been described as L-shaped or rectangularly shaped, these are not limitations of the present invention, i.e., leads 108, 110, and 116 may have other shapes. The shape of the die receiving portions, the leads and the lead frame does not limit the present invention.

In accordance with an embodiment, support 102 is an electrically conductive support structure configured to have device receiving structure 104 and device receiving structure 106. More particularly, support 102 may be manufactured from an electrically conductive material such as, for example, copper and configured to have a mating portion 132 and a mating portion 134. Support 102 can be made from a single piece of electrically conductive material such as, for example, a single piece of copper. Mating portion 132 may be referred to as a silicon support portion or silicon support structure and mating portion 134 may be referred to as a pedestal portion, a drain interconnect, a drain electrode, or a drain contact. In accordance with an embodiment, a portion of pedestal portion 134 is thicker than silicon support portion 132, i.e., silicon support portion 132 is thinner than pedestal portion 134.

Semiconductor chip 10 is mounted to device support 102 in a flip-chip configuration. As discussed with reference to FIG. 1, semiconductor chip 10 has a gate bond pad 16 formed on or from its top surface 12, a source bond pad 18 formed on or from top surface 12, and a drain contact 20 formed on or from a bottom surface 14 (shown in at least FIG. 10). The term mounted to can be referred to as being bonded to, being attached to or the like. Because semiconductor chip 10 is mounted in a flip-chip configuration, gate bond pad 16 and source bond pad 18 are hidden or blocked from view. Thus, gate bond pad 16 and source bond pad 18 are indicated by dashed lines or broken lines. Accordingly, source bond pad 18 of semiconductor chip 10 is attached to silicon support 132 and gate bond pad 16 of semiconductor chip 10 is attached to the foot portion of contact interconnect 128. More particularly, source bond pad 18 is bonded to silicon support 132 using a bonding agent 138 such as, for example, solder, and gate bond pad 16 is bonded to the foot portion of contact interconnect 128 using a bonding agent such as, for example, solder. Other suitable bonding agents include a die attach material, an electrically conductive material, or the like.

A semiconductor chip 30 is attached to semiconductor chip 10 and to pedestal portion 134. More particularly, a bonding agent such as, for example solder 138, is formed on drain contact 20 and a bonding agent 138 is formed on a portion of pedestal portion 134. Source bond pad 42 of III-N semiconductor chip 30 is bonded to drain contact 20 of semiconductor chip 10 through bonding agent 138 and a drain bond pad 42 of III-N semiconductor chip 30 is bonded to pedestal portion 134 through bonding agent 138. As described above, suitable materials for bonding agent 138 include solder, a die attach material, an electrically conductive material, or the like.

As those skilled in the art are aware, support 102, including device receiving structures 104 and 106, and semiconductor chips 10 and 30 may be encapsulated in a protection material such as, for example a mold compound. It should be noted that after encapsulation, gate lead 108, Kelvin lead 110, and source lead 116 extend from the mold compound. In accordance with an embodiment, the mold compound is a thermally enhanced mold compound. This packaging configuration follows the schematic 80 as shown in FIG. 6 where the substrate of the III-N semiconductor device is floating.

Thus, semiconductor component 100 is comprised of a semiconductor chip 30 that includes a III-N based semiconductor device 31 partially stacked on silicon chip 10 that includes a silicon based semiconductor device 11. Semiconductor chip 10 is flipped such that source bond pad 18 is in electrical contact with silicon support 132 and thereby in electrical contact with Kelvin lead 110 and source lead 116. Gate bond pad 16 of silicon chip 10 is electrically connected to gate lead 108. III-N semiconductor chip 30 is partially mounted to semiconductor chip 10 in a flip chip configuration in which source bond pad 40 of semiconductor chip 30 is electrically connected to drain contact 20 of semiconductor device 11. Gate bond pads 36 and 38 are electrically connected to tabs 122 and 124, respectively. It should be noted that tabs 122 and 124 serve as pedestal structures so that gate bond pads 36 and 38, source bond pad 40, and drain bond pad 42 are substantially in the same plane after partially mounting semiconductor chip 30 on semiconductor chip 10. However, this is not a limitation of the present invention. For example, gate bond pads 36 and 38 may be manufactured using a bump process. Similarly, a bump process can be used to form an electrically conductive spacer structure on drain contact 20.

In accordance with this embodiment, the III-N substrate or III-N semiconductor material of semiconductor chip 30 is floating, i.e., the III-N substrate is not connected to an electrical potential. Although semiconductor component 100 is shown as having bond pads not formed over active areas of semiconductor chips 10 and 30, this is not a limitation. Bond pads may be formed over active areas of semiconductor chip 10, semiconductor chip 30, or both, which lowers the cost of manufacture because additional area is not needed for bond pads. Forming the bond pads over active areas also increases the sizes of the bond pads which improves thermal performance because of an increased heat conduction. In addition, heat conduction can be further increased by forming a thermally conductive material on or in contact with surface 34 of semiconductor chip 30.

Figure 14:
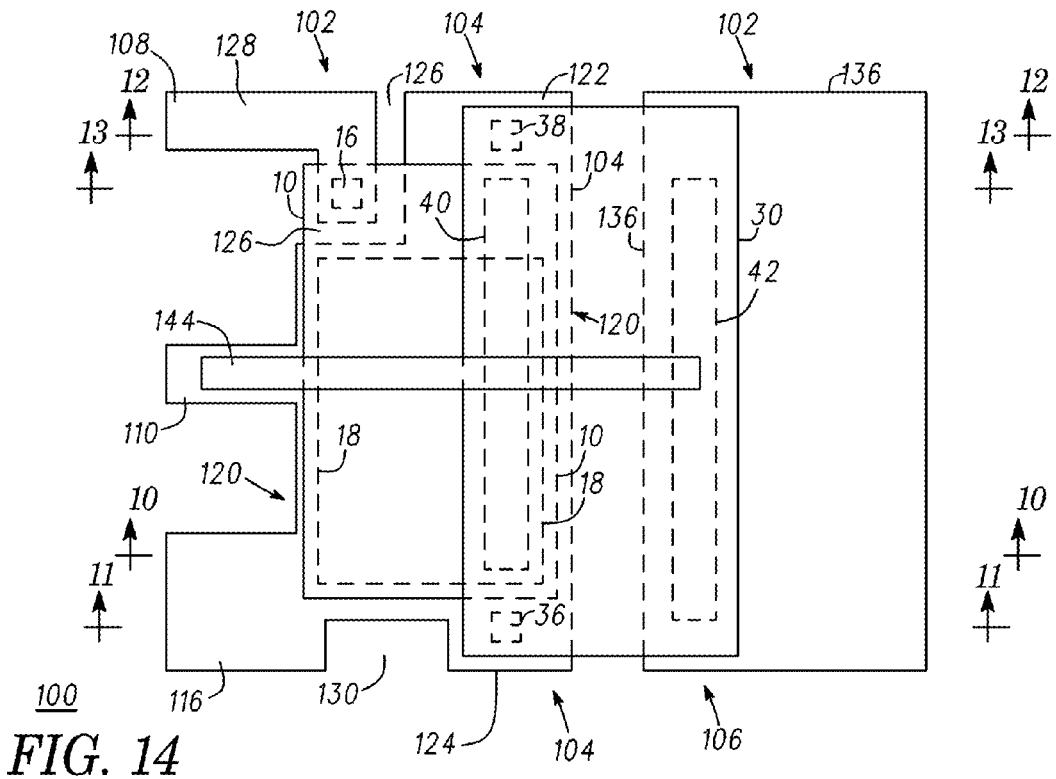
FIG. 14 is a top view of a cascode configured semiconductor component in accordance with another embodiment of the present invention.

FIG. 14 is a top view of a semiconductor component 100A comprising a support 102 to which a semiconductor chip 10 and a semiconductor chip 30 are mounted and packaged in a QFN package. Semiconductor component 100A is similar to semiconductor component 100 except that an electrically conductive clip 144 couples source lead 110 that is connected to source pad 18 of semiconductor chip 10 to the III-nitride substrate material of semiconductor component 30. In accordance with this embodiment, the III-N substrate or III-N semiconductor material of semiconductor chip 30 is not floating but electrically connected to source lead 110 which is electrically connected to source pad 18 of the silicon semiconductor chip. Although semiconductor component 100A is shown as having bond pads not formed over active areas of semiconductor chips 10 and 30, this is not a limitation. Bond pads may be formed over active areas of semiconductor chip 10, semiconductor chip 30, or both, which lowers the cost of manufacture because additional area is not needed for bond pads. Forming the bond pads over active areas also increases the sizes of the bond pads which improves thermal performance because of an increased heat conduction. In addition, heat conduction can be further increased by forming a thermally conductive material on or in contact with surface 34 of semiconductor chip 30. This packaging configuration follows the schematic 110 as shown in FIG. 8 where the substrate of the III-N semiconductor device is connected to the source of the silicon device or the source of the cascode.

Figure 15:
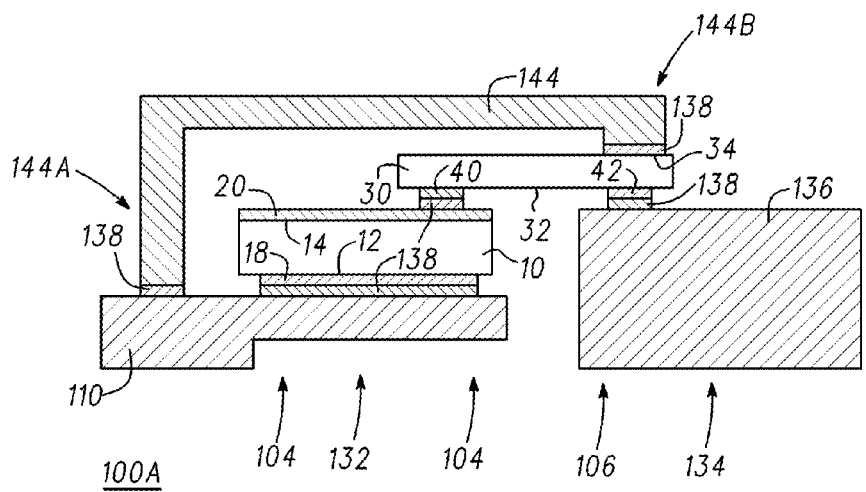
FIG. 15 is a cross-sectional view of the cascode configured semiconductor component of FIG. 14 taken along section line 15-15 of FIG. 14.

FIG. 15 is a cross-sectional view of semiconductor component 100A taken along section line 15-15 of FIG. 14. FIG. 14 is similar to FIG. 10 but includes an electrically conductive clip 144 having ends 144A and 144B, where end 144A is coupled to source lead 110 by a bonding agent 138 and an end 144B coupled to the substrate of III-N semiconductor chip 30. Thus, electrically conductive clip 144 connects the source of semiconductor chip 10 to the substrate of semiconductor chip 30.

Figure 16:
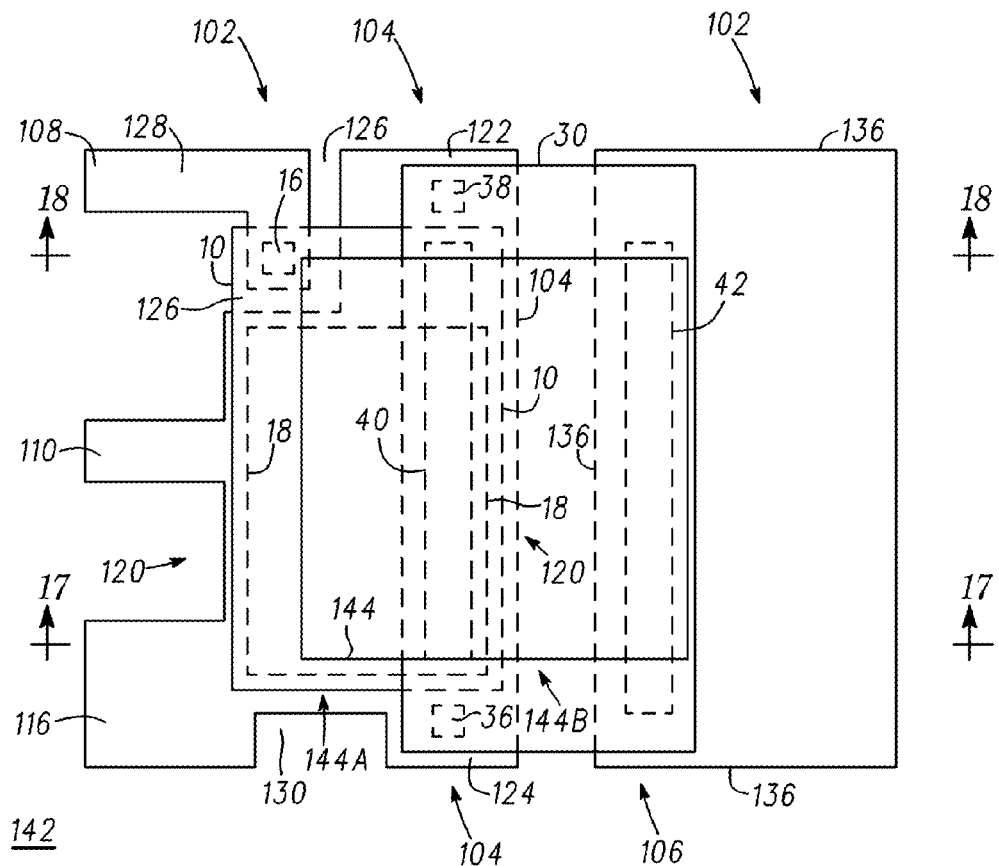
FIG. 16 is a top view of a cascode configured semiconductor component in accordance with another embodiment of the present invention.
Figure 17:
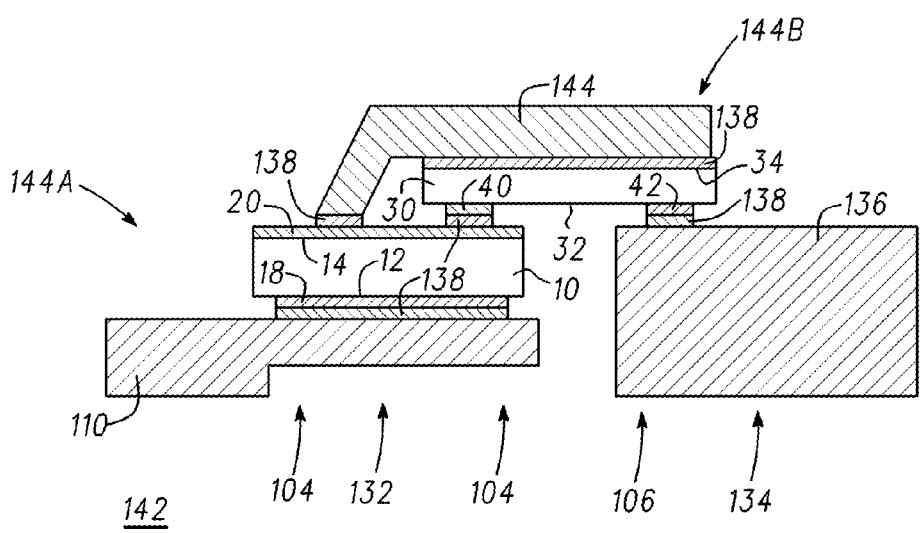
FIG. 17 is a cross-sectional view of the cascode configured semiconductor component of FIG. 16 taken along section line 17-17 of FIG. 16.
Figure 18:
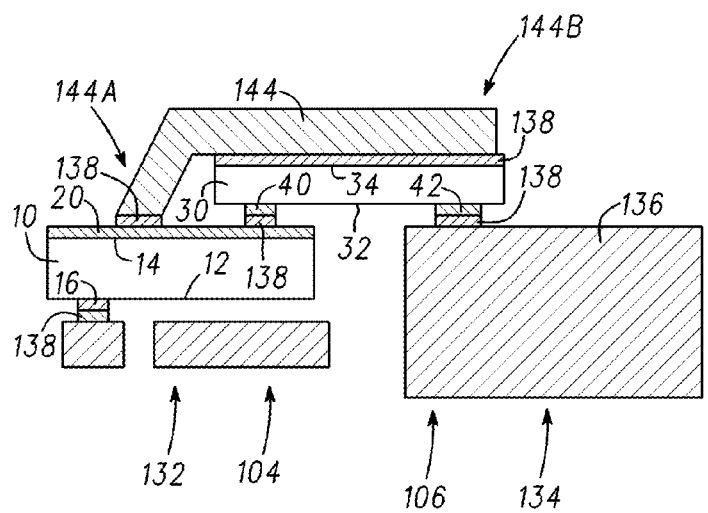
FIG. 18 is a cross-sectional view of the cascode configured semiconductor component of FIG. 16 taken along section line 18-18 of FIG. 16.

FIG. 16 is a top view of a semiconductor component 142 comprising a support 102 to which a semiconductor chip 10 and a semiconductor chip 30 are mounted and packaged in a QFN package. FIG. 17 is a cross-sectional view of semiconductor component 142 taken along section line 17-17 of FIG. 16 and FIG. 18 is a cross-sectional view of semiconductor component 142 taken along section line 18-18 of FIG. 16. For the sake of clarity, FIGS. 16-18 are described together. Semiconductor component 142 is similar to semiconductor component 100 except that an electrically conductive clip 144 couples drain contact 20 of semiconductor chip 10 to the III-nitride substrate material of semiconductor component 30. It should be appreciated that the cross-sectional views indicated by section lines 11-11 and 12-12 in FIG. 9 also correspond to similar regions of FIG. 16. Thus, FIGS. 11 and 12 are representative cross-sectional views in FIGS. 9 and 16.

Referring to FIGS. 17 and 18, electrically conductive clip 144 has an end 144A electrically connected to drain contact 20 of semiconductor device 11 through bonding agent 138 and a region 144B electrically connected to the III-nitride semiconductor material of semiconductor chip 30 through bonding agent 138.

In accordance with this embodiment, the III-N substrate or III-N semiconductor material of semiconductor chip 30 is not floating but electrically connected to drain contact 20. Although semiconductor component 142 is shown as having bond pads not formed over active areas of semiconductor chips 10 and 30, this is not a limitation. Bond pads may be formed over active areas of semiconductor chip 10, semiconductor chip 30, or both, which lowers the cost of manufacture because additional area is not needed for bond pads. Forming the bond pads over active areas also increases the sizes of the bond pads which improves thermal performance because of an increased heat conduction. In addition, heat conduction can be further increased by forming a thermally conductive material on or in contact with surface 34 of semiconductor chip 30. This packaging configuration follows the schematic 90 as shown in FIG. 7 where the substrate of III-N device 30 is connected to its own source and to the drain of the silicon semiconductor chip 10.

Figure 19:
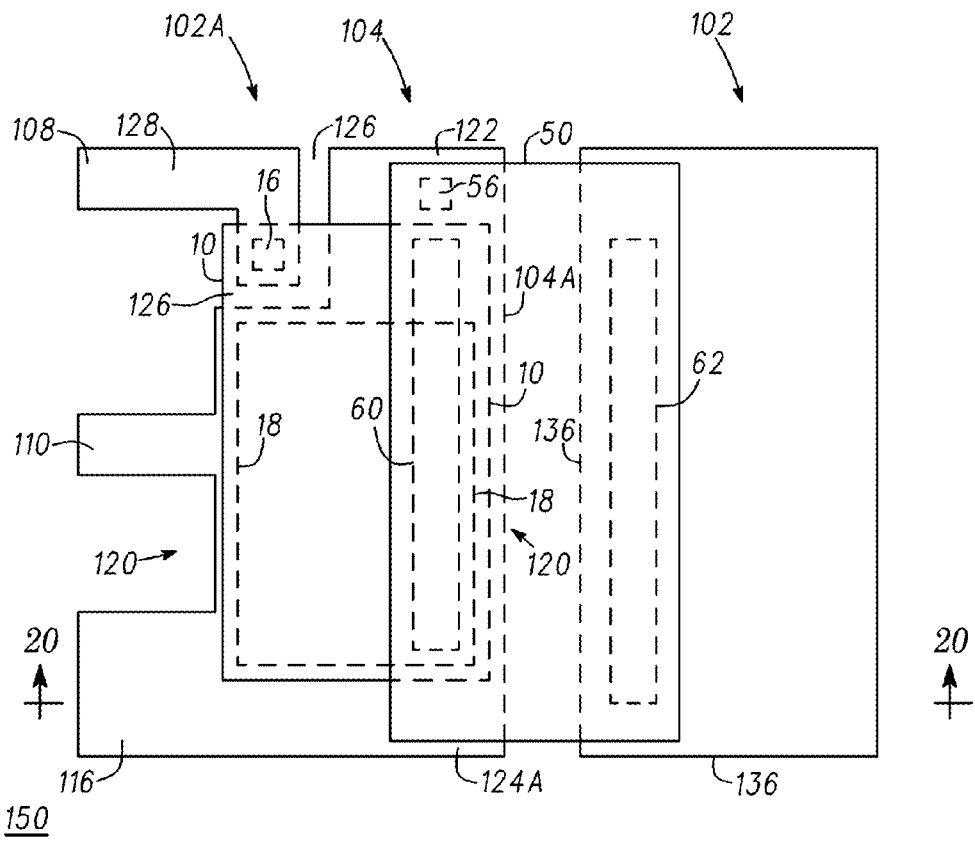
FIG. 19 is a top view of a cascode configured semiconductor component in accordance with another embodiment of the present invention.
Figure 20:
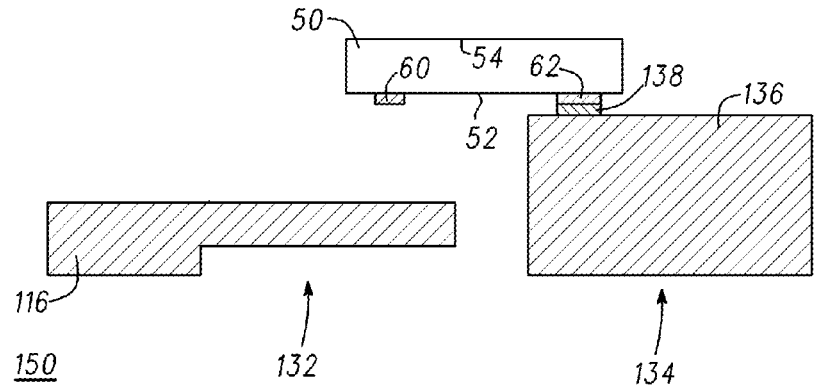
FIG. 20 is a cross-sectional view of the cascode configured semiconductor component of FIG. 19 taken along section line 20-20 of FIG. 19.

FIG. 19 is a top view of a semiconductor component 150 comprising a support 102A to which a semiconductor chip 10 and a semiconductor chip 50 are mounted and packaged in a QFN package. FIG. 20 is a cross-sectional view of semiconductor component 142 taken along section line 20-20 of FIG. 19. For the sake of clarity, FIGS. 19 and 20 are described together. Semiconductor component 150 is similar to semiconductor component 100 except that notch 130 and tab 124 are absent from semiconductor component 150 and semiconductor chip 30 has been replaced by semiconductor chip 50 described with reference to FIG. 4. Thus, the support structure of semiconductor component 150 shown in FIGS. 19 and 20 is identified by reference character 102A. It should be appreciated that the cross-sectional views indicated by section lines 10-10, 12-12, and 13-13 in FIG. 9 also correspond to similar regions of FIG. 19. Thus, FIGS. 10, 12, and 13 are representative cross-sectional views in FIGS. 9 and 19.

In accordance with this embodiment, the III-N substrate or III-N semiconductor material of semiconductor chip 50 is floating, i.e., the III-N substrate is not electrically connected to a source of potential. Although semiconductor component 150 is shown as having bond pads not formed over active areas of semiconductor chips 10 and 50, this is not a limitation. Bond pads may be formed over active areas of semiconductor chip 10, semiconductor chip 50, or both, which lowers the cost of manufacture because additional area is not needed for bond pads. Forming the bond pads over active areas also increases the sizes of the bond pads which improves thermal performance because of an increased heat conduction. In addition, heat conduction can be further increased by forming a thermally conductive material on or in contact with surface 54 of semiconductor chip 50. Semiconductor component 150 can be represented schematically by schematic 80 shown in FIG. 6, where the substrate of the III-N semiconductor device 50 is floating.

Figure 21:
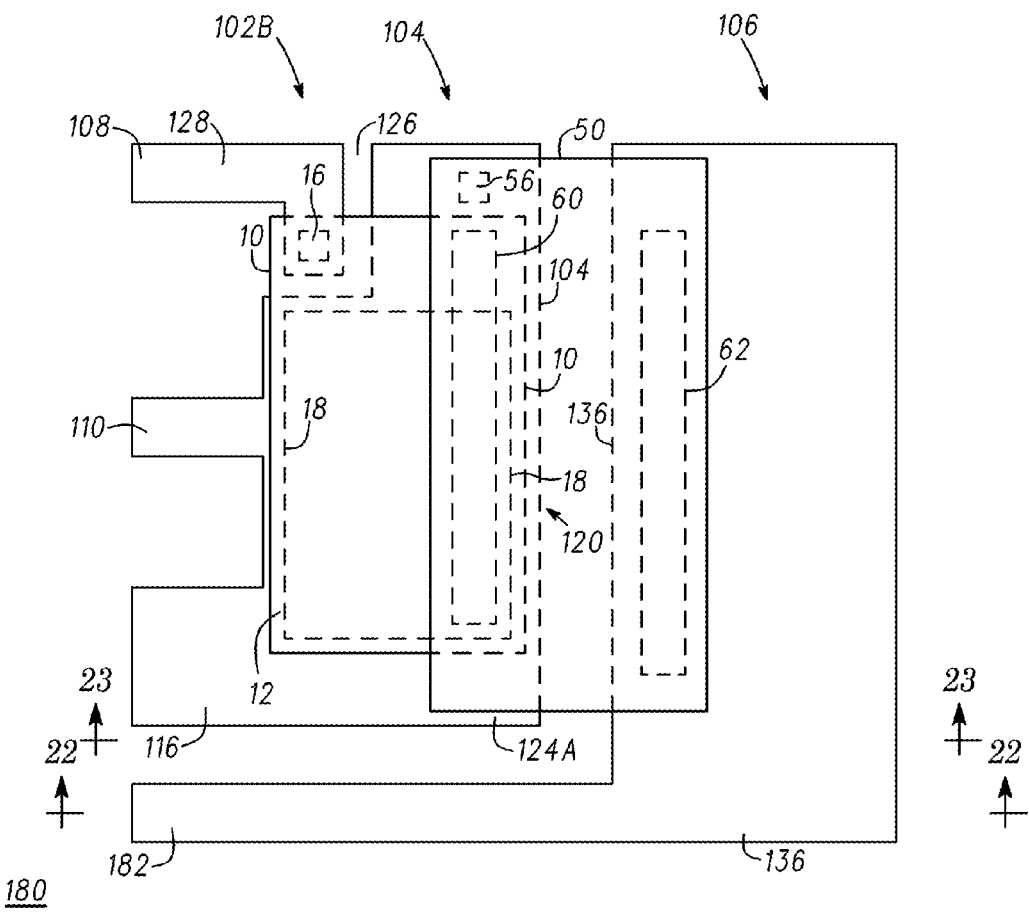
FIG. 21 is a top view of a cascode configured semiconductor component in accordance with another embodiment of the present invention.
Figure 22:
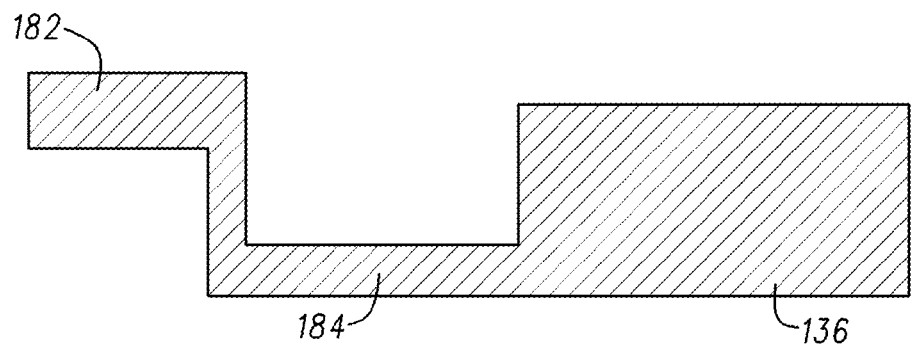
FIG. 22 is a cross-sectional view of the cascode configured semiconductor component of FIG. 21 taken along section line 22-22 of FIG. 21.
Figure 23:
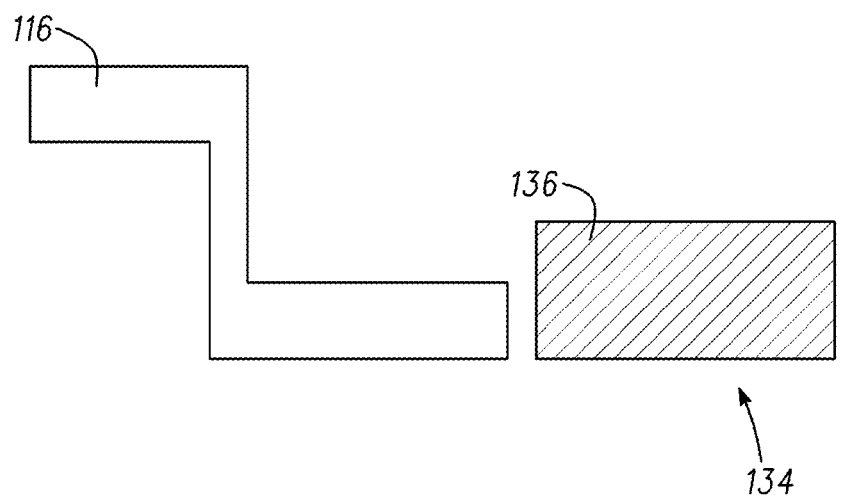
FIG. 23 is a cross-sectional view of the cascode configured semiconductor component of FIG. 21 taken along section line 23-23 of FIG. 21.

FIG. 21 is a top view of a semiconductor component 180 comprising a support 102B to which a semiconductor chip 10 and a semiconductor chip 50 are mounted and may be packaged in a through hole package such as, for example, a TO-220 package, a TO-247 package, a TO-264 package, a TO-257 package, or the like. FIG. 22 is a cross-sectional view of semiconductor component 180 taken along section line 22-22 of FIG. 21 and FIG. 23 is a cross-sectional view of semiconductor component 180 taken along section line 23-23 of FIG. 21. For the sake of clarity, FIGS. 21-23 are described together. Semiconductor component 180 is similar to semiconductor component 150 except that support 102B has been configured to include a drain lead 182 extending from body of electrically conductive material 136. Thus, the support of semiconductor component 180 shown in FIGS. 21-23 is identified by reference character 102B. It should be appreciated that the cross-sectional views indicated by section lines 12-12 and 13-13 in FIG. 9 also correspond to similar regions of FIG. 21. Thus, FIGS. 12 and 13 are representative cross-sectional views in FIGS. 9 and 21.

FIG. 22 illustrates that drain electrode 182 is connected to body of electrically conductive material 136 by an electrical connector 184 and FIG. 18 illustrates that electrical connector 182 and drain electrode 116 of support 102B are electrically isolated from device receiving structure 104.

In accordance with this embodiment, the III-N substrate or III-N semiconductor material of semiconductor chip 50 is floating, i.e., the III-N substrate is not connected to an electrical potential. Although semiconductor component 180 is shown as having bond pads not formed over active areas of semiconductor chips 10 and 50, this is not a limitation. Bond pads may be formed over active areas of semiconductor chip 10, semiconductor chip 50, or both, which lowers the cost of manufacture because additional area is not needed for bond pads. Forming the bond pads over active areas also increases the sizes of the bond pads which improves thermal performance because of an increased heat conduction. In addition, heat conduction can be further increased by forming a thermally conductive material on or in contact with surface 54 of semiconductor chip 50. Semiconductor component 150 can be represented schematically by schematic 80 shown in FIG. 6, where the substrate of the III-N semiconductor device 50 is floating.

Figure 24:
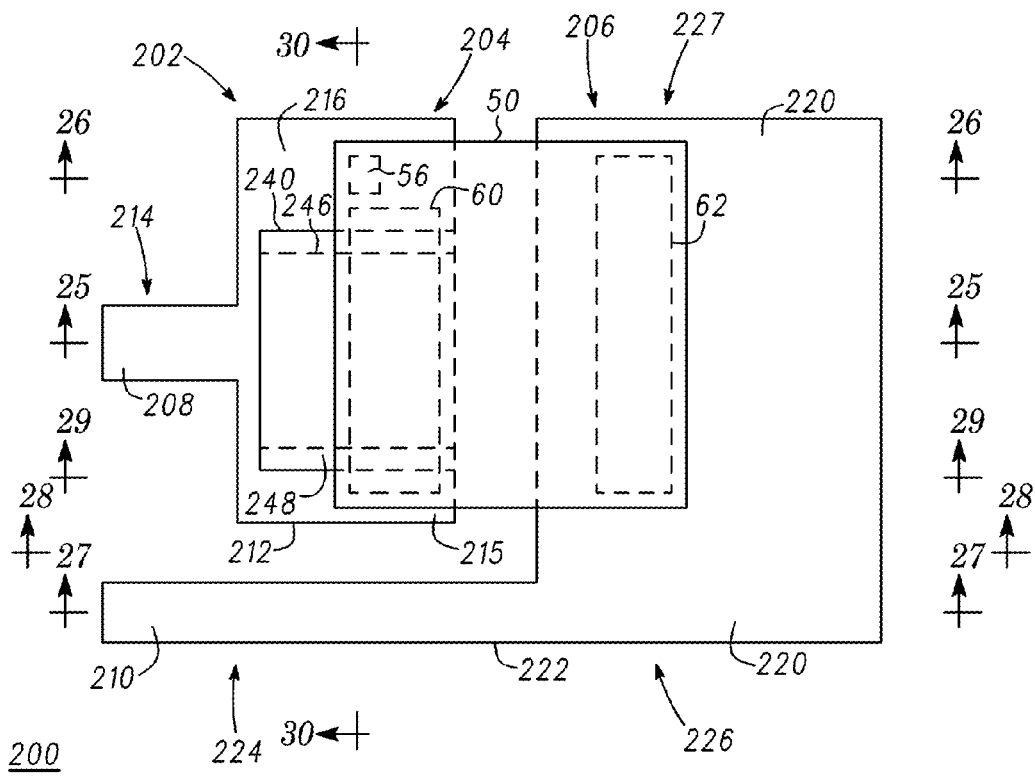
FIG. 24 is a top view of a cascode configured semiconductor component in accordance with another embodiment of the present invention.
Figure 25:
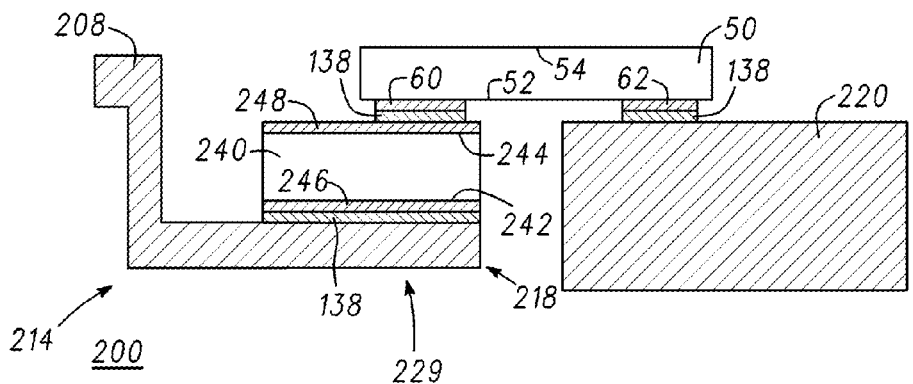
FIG. 25 is a cross-sectional view of the cascode configured semiconductor component of FIG. 24 taken along section line 25-25 of FIG. 24.
Figure 26:
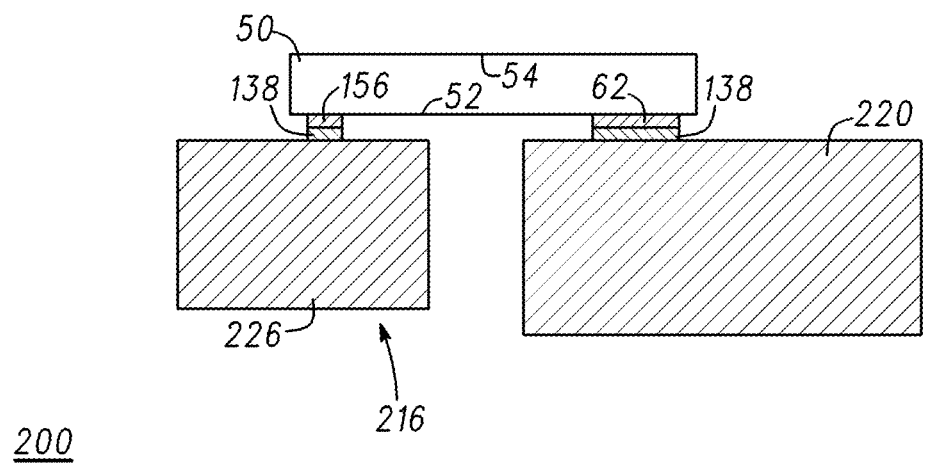
FIG. 26 is a cross-sectional view of the cascode configured semiconductor component of FIG. 24 taken along section line 26-26 of FIG. 24.
Figure 27:
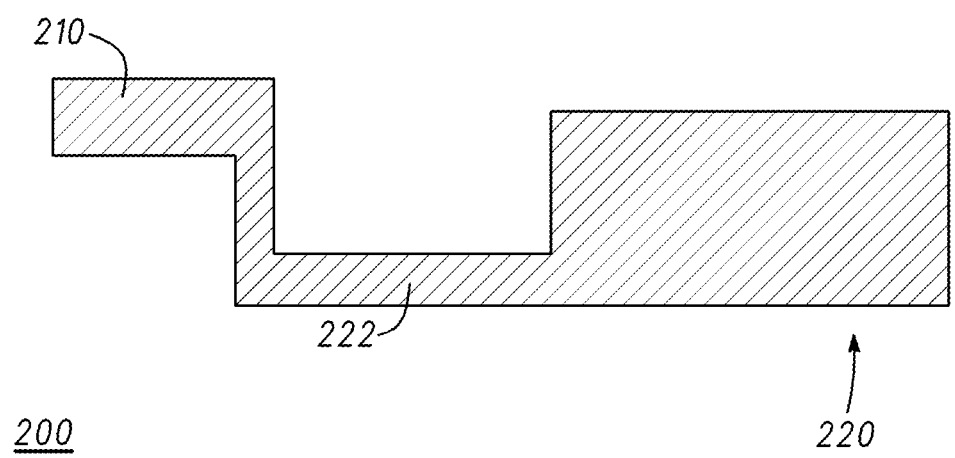
FIG. 27 is a cross-sectional view of the cascode configured semiconductor component of FIG. 24 taken along section line 27-27 of FIG. 24.
Figure 28:
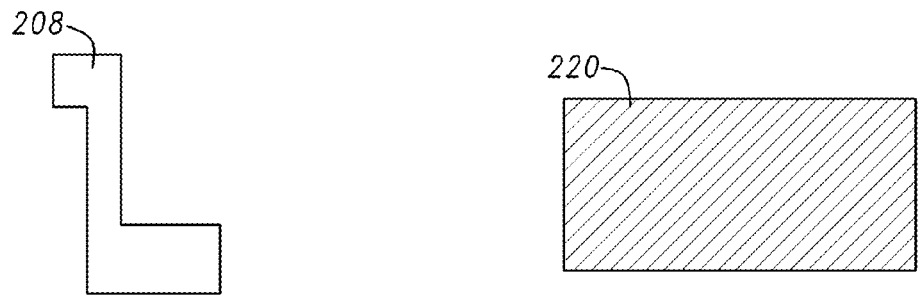
FIG. 28 is a cross-sectional view of the cascode configured semiconductor component of FIG. 24 taken along section line 28-28 of FIG. 24.
Figure 29:
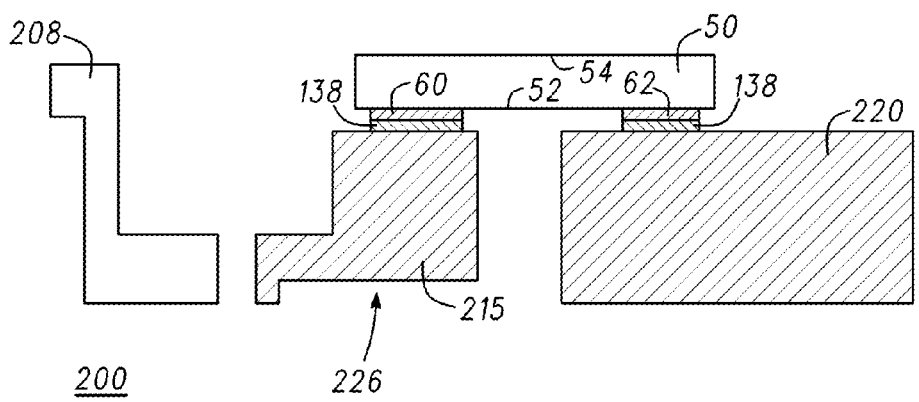
FIG. 29 is a cross-sectional view of the cascode configured semiconductor component of FIG. 24 taken along section line 29-29 of FIG. 24.
Figure 30:
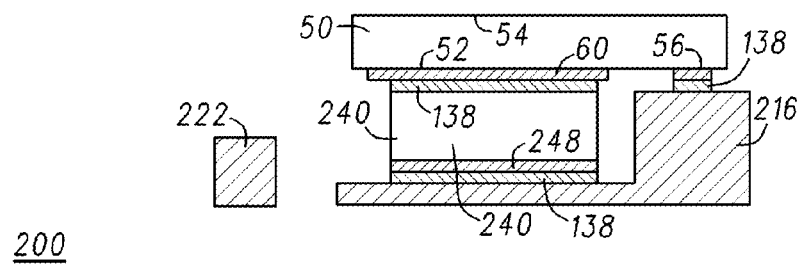
FIG. 30 is a cross-sectional view of the cascode configured semiconductor component of FIG. 24 taken along section line 30-30 of FIG. 24.

FIG. 24 is a top view of a semiconductor component 200 comprising a support 202 to which a semiconductor chip 240 and a semiconductor chip 50 are mounted. FIG. 25 is a cross-sectional view of semiconductor component 200 taken along section line 25-25 of FIG. 24; FIG. 26 is a cross-sectional view of semiconductor component 200 taken along section line 26-26 of FIG. 24; FIG. 27 is a cross-sectional view of semiconductor component 200 taken along section line 27-27 of FIG. 24; FIG. 28 is a cross-sectional view of semiconductor component 200 taken along section line 28-28 of FIG. 24; FIG. 29 is a cross-sectional view of semiconductor component 200 taken along section line 29-29 of FIG. 24; and FIG. 30 is a cross-sectional view of semiconductor component 200 taken along section line 30-30 of FIG. 24. For the sake of clarity, FIGS. 24-30 are described together. Support 202 includes device receiving structures 204 and 206, an anode lead 208, a cathode lead 210, and may be packaged in a through hole package such as, for example, a TO-220 package, a TO-247 package, a TO-264 package, a TO-257 package, or the like. Device receiving structure 204 includes a rectangularly shaped portion 212 having a tab or connector 214 extending from a side. Thus, rectangularly shaped portion 212 and tab 214 form a T-shape having side regions 215 and 216. Side regions 215 and 216 may be referred to as pedestals or pedestal structures. Rectangularly shaped portion 212 serves as a device receiving area and a portion of tab 214 serves as anode lead 208.

Device receiving structure 206 includes a body of electrically conductive material 220 that is spaced apart and electrically isolated from device receiving area 212. An electrical connector or interconnect 222 extends from body of electrically conductive material 220, wherein a portion of electrical connector 222 serves as cathode lead 210. Although leads 208 and 210 have been described as being rectangularly shaped, these are not limitations of the present invention, e.g., leads 208 and 210 may have other shapes.

In accordance with an embodiment, support 202 is an electrically conductive support structure configured to have device receiving structure 204 and device receiving structure 206. More particularly, support 202 may be manufactured from an electrically conductive material such as, for example, copper and configured to have a mating portion 224 and a mating portion 226. Support 202 can be made from a single piece of electrically conductive material such as, for example, a single piece of copper. A subportion of mating portion 224 serves as device receiving area 212 and subportions of mating portion 224 serve as side regions 215 and 216. Device receiving area 212 may be referred to as a silicon support portion or silicon support structure. A subportion 227 of mating portion 226 serves as a drain contact region and may be referred to as a pedestal portion, a drain interconnect, a drain electrode, or a drain contact. In accordance with an embodiment, a notch 229 is formed from device receiving structure 204. Thus, a device receiving structure 204 is thinner than device receiving structure 206 or includes a portion that is thinner than device receiving structure 204. Electrical connector 222 extends from body of electrically conductive material 220, wherein a portion of electrical connector 222 serves as cathode lead 210.

Semiconductor chip 240 is mounted to device support 202 in a flip-chip configuration. Semiconductor chip 240 has a surface 242 and a surface 244, wherein an anode contact 246 is formed from or on surface 242 and a cathode contact 248 is formed from or on surface 244. Anode contact 246 is bonded to tab 214 using a bonding agent 138 which may be, for example, solder. Other suitable bonding agents include a die attach material, a metal, an electrically conductive material, or the like. The term bonded to can be referred to as being mounted to, being attached to, or the like. Anode contact 246 is hidden or blocked from view in FIG. 24 and is therefore indicated by broken lines or dashed lines.

A semiconductor chip 50 is attached to semiconductor chip 240 and to drain contact region 227. More particularly, a bonding agent such as, for example solder 138 is formed on anode contact 248, on pedestal portion 216, and on drain contact region 227. Source bond pad 60 of III-N semiconductor chip 50 is bonded to cathode contact 248 of semiconductor chip 240, gate bond pad 56 is bonded to pedestal 216, and drain bond pad 62 is bonded to drain contact region 227 using bonding agent 138.

As those skilled in the art are aware, support 202 including device receiving structures 204 and 206 and semiconductor chips 240 and 50 may be encapsulated in a protective material such as, for example a mold compound. It should be noted that after encapsulation, anode lead 208 and cathode lead 210 extend from the mold compound. In accordance with an embodiment, the mold compound is a thermally enhanced mold compound.

Thus, semiconductor component 200 is comprised of a semiconductor chip 50 that includes a III-N based semiconductor substrate partially stacked on silicon chip 240 that includes a silicon based semiconductor substrate. Semiconductor chip 50 is flipped such that source bond pad 60 is in electrical contact with cathode 248. III-N semiconductor chip 50 is partially mounted to semiconductor chip 240 in a flip chip configuration in which source bond pad 60 of semiconductor chip 50 is electrically connected to cathode contact 248 of semiconductor chip 240. Gate bond pad 56 is electrically connected to pedestal 216. It should be noted that pedestal 216 serve as pedestal structures so that gate bond pad 56, source bond pad 60, and drain bond pad 62 are substantially in the same plane after partially mounting semiconductor chip 50 on semiconductor chip 240 and to provide a means to help secure semiconductor chip 240 on support 202. However, this is not a limitation of the present invention. For example, gate bond pad 56 may be manufactured using a bump process. Similarly, a bump process can be used to form an electrically conductive spacer structure on cathode contact 248.

In accordance with this embodiment, the III-N substrate or III-N semiconductor material of semiconductor chip 50 is floating, i.e., not electrically connected to a source of potential. Although semiconductor component 200 is shown as having bond pads not formed over active areas of semiconductor chip 50, this is not a limitation. Bond pads may be formed over active areas of semiconductor chip 50, which lowers the cost of manufacture because additional area is not needed for bond pads. Forming the bond pads over active areas also increases the sizes of the bond pads which improves thermal performance because of an increased heat conduction. In addition, heat conduction can be further increased by forming a thermally conductive material on or in contact with surface 54 of semiconductor chip 50.

Figure 31:
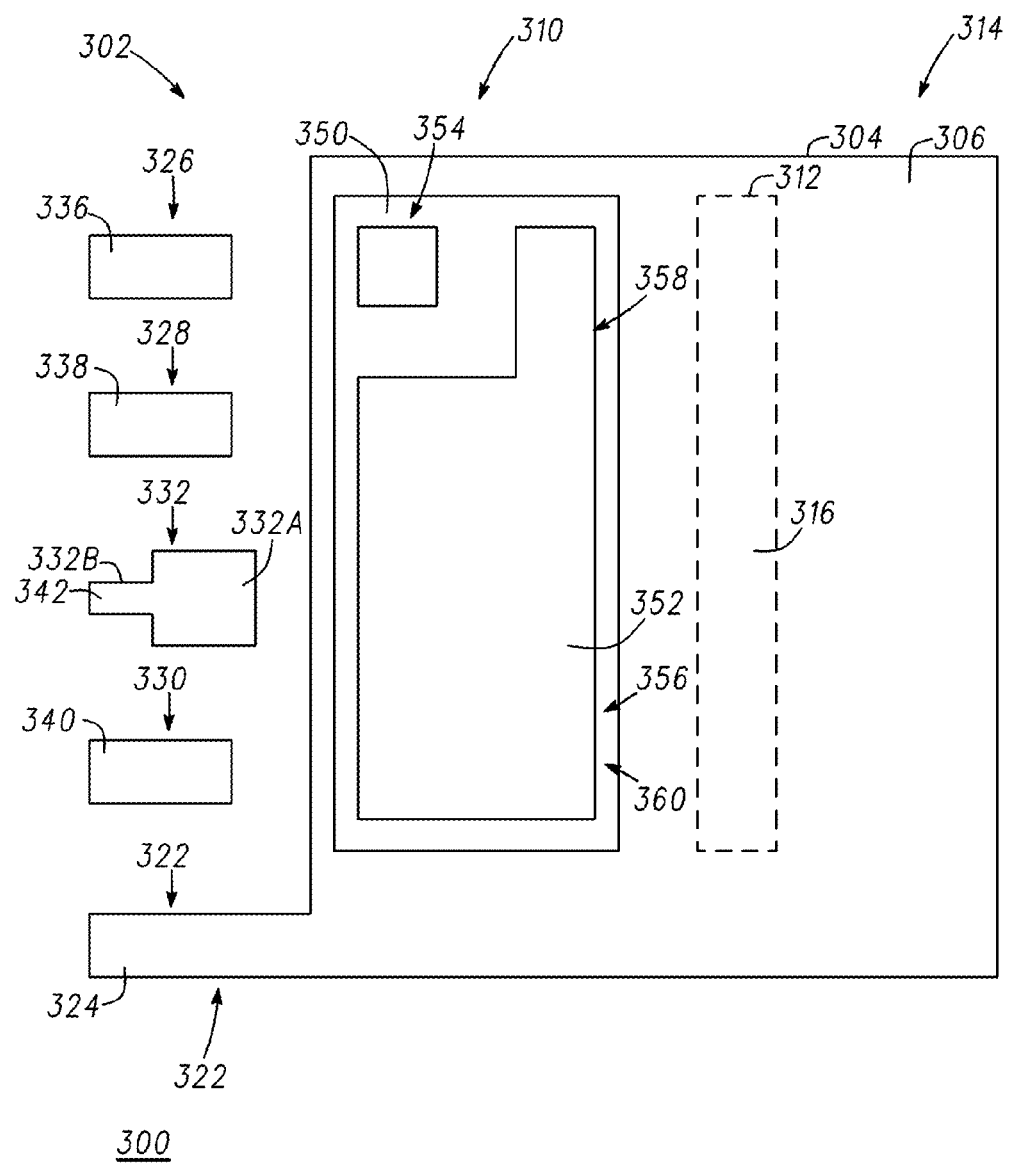
FIG. 31 is a top view of a cascode configured semiconductor component in accordance with another embodiment of the present invention.
Figure 32:
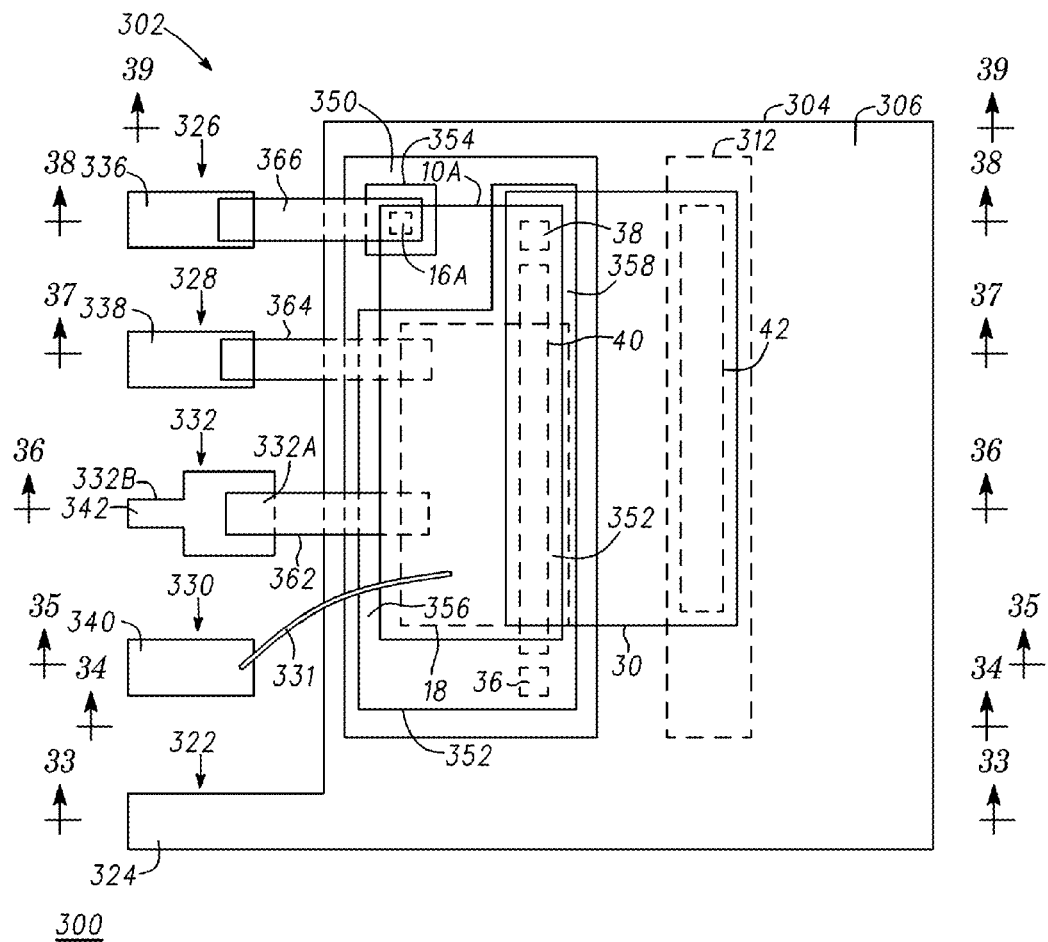
FIG. 32 is a top view of the cascode configured semiconductor component of FIG. 31 during manufacture in accordance with another embodiment of the present invention.
Figure 33:
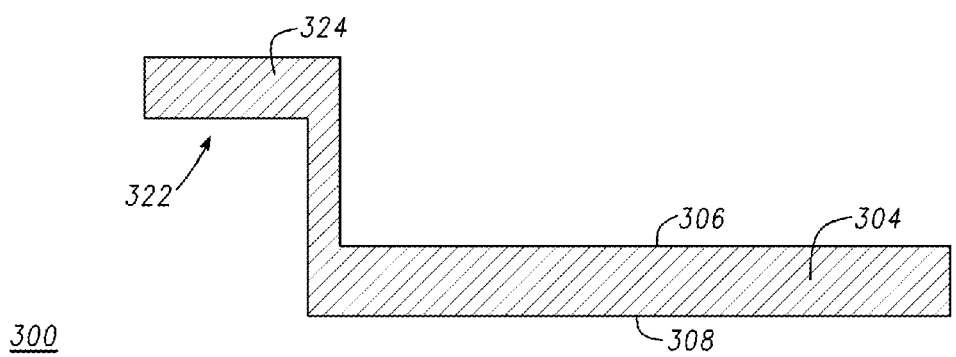
FIG. 33 is a cross-sectional view of the cascode configured semiconductor component of FIG. 32 taken along section line 33-33 of FIG. 32.
Figure 34:
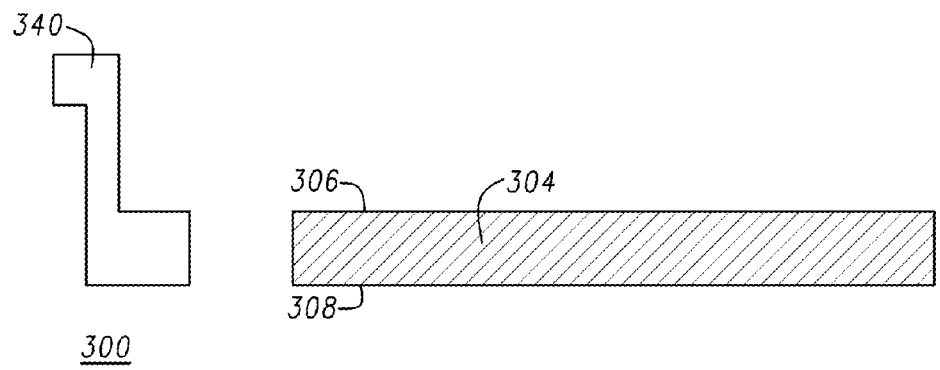
FIG. 34 is a cross-sectional view of the cascode configured semiconductor component of FIG. 32 taken along section line 34-34 of FIG. 32.
Figure 35:
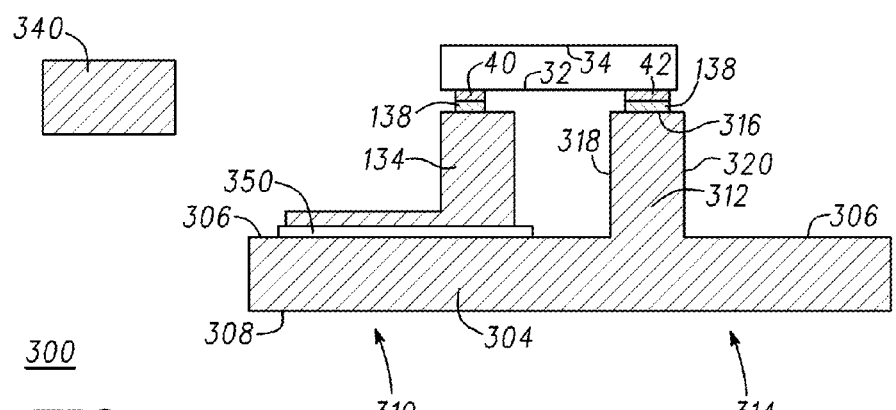
FIG. 35 is a cross-sectional view of the cascode configured semiconductor component of FIG. 32 taken along section line 35-35 of FIG. 32.
Figure 36:
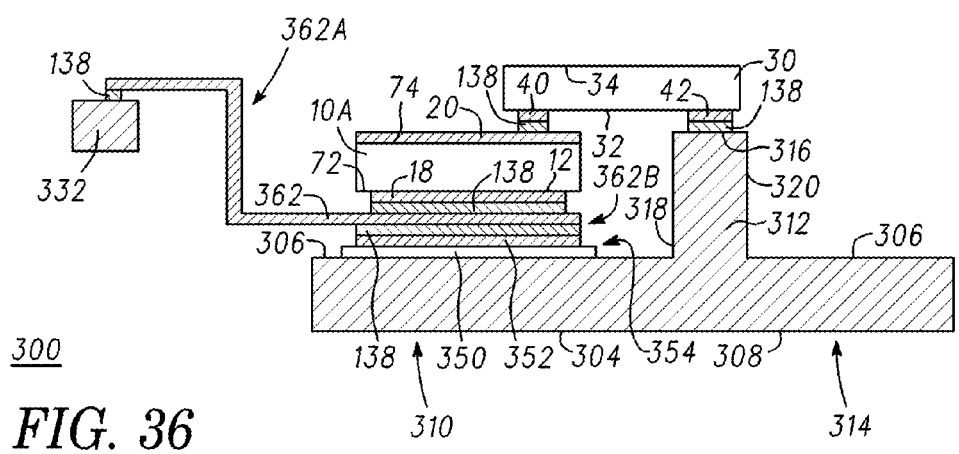
FIG. 36 is a cross-sectional view of the cascode configured semiconductor component of FIG. 32 taken along section line 36-36 of FIG. 32.
Figure 37:
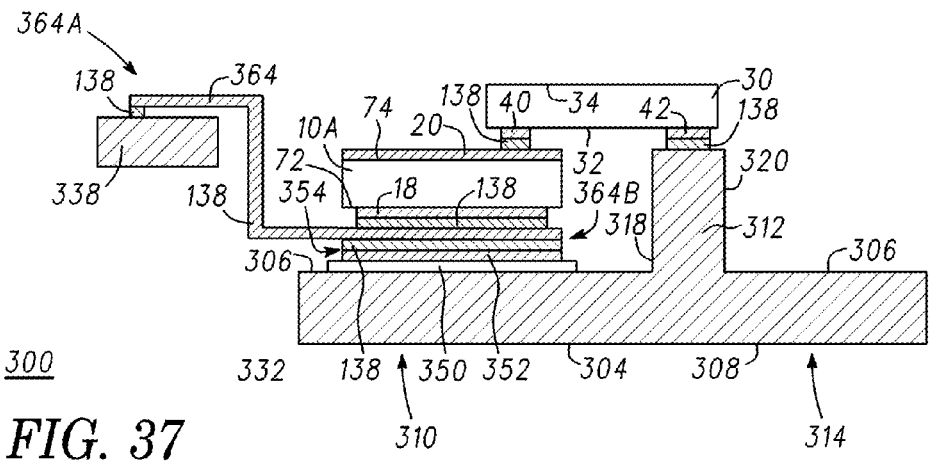
FIG. 37 is a cross-sectional view of the cascode configured semiconductor component of FIG. 32 taken along section line 37-37 of FIG. 32.
Figure 38:
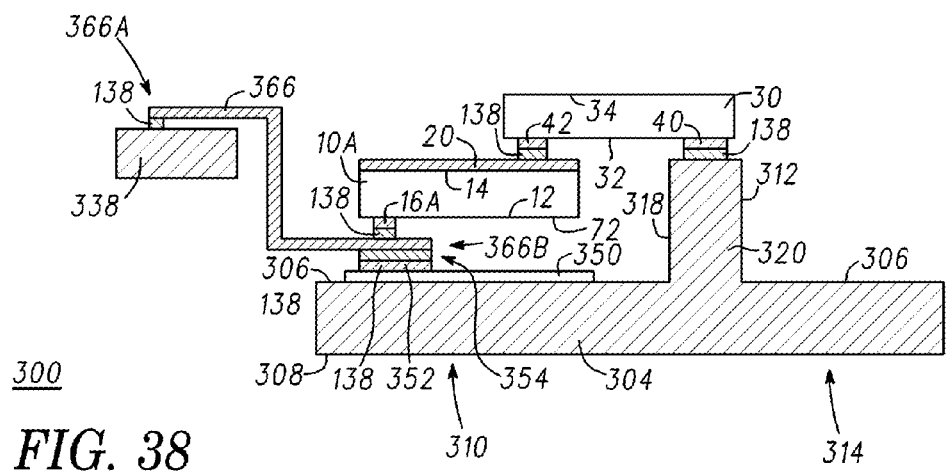
FIG. 38 is a cross-sectional view of the cascode configured semiconductor component of FIG. 32 taken along section line 38-38 of FIG. 32.
Figure 39:
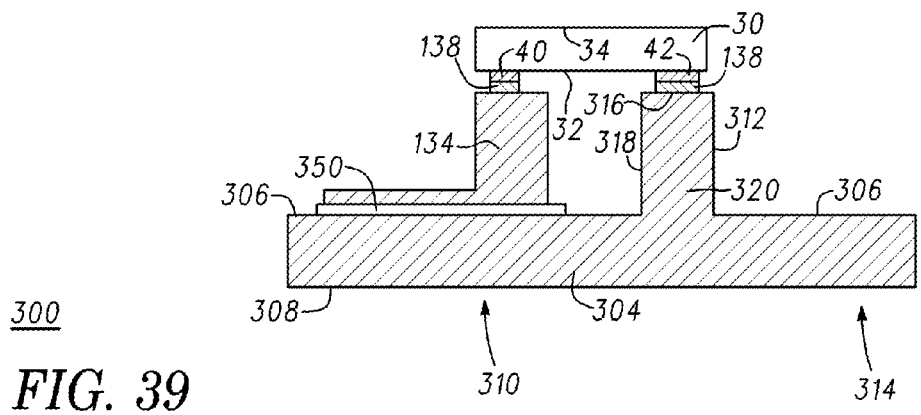
FIG. 39 is a cross-sectional view of the cascode configured semiconductor component of FIG. 32 taken along section line 39-39 of FIG. 32.

FIG. 31 is a top view of a support 302 configured for manufacturing a semiconductor component 300. Semiconductor component 300 includes a semiconductor chip 10A (shown in FIG. 2) and a semiconductor chip 30 mounted to support 302 in accordance with another embodiment of the present invention. FIG. 32 is a top view of semiconductor component 300 during manufacture. FIG. 33 is a cross-sectional view of semiconductor component 300 taken along section line 33-33 of FIG. 32; FIG. 34 is a cross-sectional view of semiconductor component 300 taken along section line 34-34 of FIG. 32; FIG. 35 is a cross-sectional view of semiconductor component 300 taken along section line 35-35 of FIG. 32; FIG. 36 is a cross-sectional view of semiconductor component 300 taken along section line 36-36 of FIG. 32; FIG. 37 is a cross-sectional view of semiconductor component 300 taken along section line 37-37 of FIG. 32; FIG. 38 is a cross-sectional view of semiconductor component 300 taken along section line 38-38 of FIG. 32; and FIG. 39 is a cross-sectional view of semiconductor component 300 taken along section line 39-39 of FIG. 32. For the sake of clarity, FIGS. 31-39 are described together. Support 302 is comprised of an electrically conductive substrate 304 having major surfaces 306 and 308 and includes a device receiving area 310, a pedestal 312, and an extension 314. Support 302 may be packaged in a through hole package such as, for example, a TO-220 package, a TO-247 package, a TO-264 package, a TO-257 package, or the like. In accordance with an embodiment, electrically conductive substrate 304 has a rectangular shape having four corner regions. Pedestal 312 laterally separates device receiving area 310 from extension 314, i.e., pedestal 312 is between device receiving area 310 and extension 314. Pedestal 312 extends upward from surface 306 and has a surface 316 and sidewalls 318 and 320. In accordance with an embodiment, electrically conductive substrate 304 is copper. Other suitable materials for electrically conductive substrate 304 include aluminum, silver, or the like.

An electrical extension 322 extends from a corner region of electrically conductive substrate 304, wherein a portion of extension 322 serves as a drain lead 324. Semiconductor component 300 further includes a rectangularly shaped interconnect 326 that is electrically isolated from electrically conductive substrate 304, a rectangularly shaped interconnect 328 that is electrically isolated from electrically conductive substrate 304, a rectangularly shaped interconnect 330 that is electrically isolated from electrically conductive substrate 304, and an interconnect 332 that is electrically isolated from electrically conductive substrate 304. By way of example, interconnect 332 has a square shaped body region 332A and an extension 332B extending from square shaped body region 332A. A portion 336 of interconnect 326 serves as a gate lead, a portion 338 of interconnect 328 serves as a Kelvin lead, a portion 340 of interconnect 330 serves as a sense lead, and a portion 342 of interconnect 332 serves as a source lead. Although interconnects 326, 328, and 330 have been described as having rectangular shapes and interconnect 332 has been described as having a square shape with an extension, this is not a limitation of the present invention and interconnects 326, 328, 330, and 332 may have other shapes.

FIG. 33 illustrates drain lead 324 and extension 322 extending from electrically conductive substrate 304.

A layer of electrically insulating material 350 is formed on device receiving area 310. In accordance with an embodiment, electrically insulating layer 350 comprises a ceramic material. An electrically conductive material is formed on electrically insulating layer 350 and patterned to form a device receiving structure 352 and an interconnect structure 354. In accordance with an embodiment, device receiving structure 352 has a rectangularly shaped device receiving area 356 having an extension 358 extending from one side and a contact region 360 formed at the opposite side from which extension 358 extends. Interconnect structure 354 is a rectangularly shaped structure that serves as an interconnect structure for a gate electrode. Like contact region 360, extension 358 also serves as a contact region and may be referred to as a contact region 358. Electrically conductive substrate 304, electrically insulating layer 350, and electrically conductive material 352 form a direct bonded copper substrate 354.

Source lead 342 and Kelvin lead 338 are electrically connected to device receiving structure 352 by electrically conductive elements 362 and 364, respectively, and gate lead 336 is electrically connected to interconnect structure 354 by an electrically conductive element 366. By way of example, electrically conductive elements 362, 364, and 366 are clips. Clip 362 has an end 362A bonded to interconnect 332 by an electrically conductive bonding agent 138 and an end 362B bonded to device receiving structure 352 by an electrically conductive bonding agent 138. Clip 364 has an end 364A bonded to interconnect 338 by an electrically conductive bonding agent 138 and an end 364B bonded to device receiving structure 352 by an electrically conductive bonding agent 138. Clip 366 has an end 366A bonded to interconnect 326 by an electrically conductive bonding agent 138 and an end 366B bonded to device receiving structure 352 by an electrically conductive bonding agent 138. Electrically conductive bonding agent 138 may be solder, an electrically conductive paste, or the like.

A semiconductor chip 10A is mounted to clips 362, 364, and 366 in a flip chip configuration. More particularly, a source bond bad 18 is bonded to clip 362 and to clip 364 via electrically conductive bonding agent 138 and gate bond pad 16A is bonded to clip 366 via bonding agent 138. The term mounted to can be referred to as being bonded to, being attached to or the like. Drain contact 20 is bonded to sense lead 340 by a bonding wire 331. Because semiconductor chip 10A is mounted in a flip-chip configuration, gate bond pad 16A and source bond pad 18 are hidden or blocked from view. Thus, gate bond pad 16A and source bond pad 18 are indicated by dashed lines or broken lines in FIG. 32.

A semiconductor chip 30 is attached to semiconductor chip 70 and to pedestal 312. More particularly, a bonding agent 138 is formed on drain contact 20 and a bonding agent 138 is formed on a portion of pedestal portion 134. A source bond pad 40 of III-N semiconductor chip 30 is bonded to drain contact 20 of semiconductor chip 10A through bonding agent 138 and a drain bond pad 42 of III-N semiconductor chip 30 is bonded to pedestal 312 through bonding agent 138. As described above, suitable materials for bonding agent 138 include solder, an electrically conductive paste, or the like.

As those skilled in the art are aware, support 302 and semiconductor chips 10A and 30 may be encapsulated in a protection material such as, for example a mold compound. It should be noted that after encapsulation, gate lead 336, Kelvin lead 338, source lead 342, sense lead 340, and drain lead 324 extend from the mold compound. In accordance with an embodiment, the mold compound is a thermally enhanced mold compound.

In accordance with this embodiment, the III-N substrate or III-N semiconductor material of semiconductor chip 30 is floating, i.e., the III-N substrate is not connected to an electrical potential or to a fixed potential. Although semiconductor component 300 is shown as having bond pads not formed over active areas of semiconductor chips 10A and 30, this is not a limitation. Bond pads may be formed over active areas of semiconductor chip 10A, semiconductor chip 30, or both, which lowers the cost of manufacture because additional area is not needed for bond pads. Forming the bond pads over active areas also increases the sizes of the bond pads which improves thermal performance because of an increased heat conduction. In addition, heat conduction can be further increased by forming a thermally conductive material on or in contact with surface 34 of semiconductor chip 30.

Figure 40:
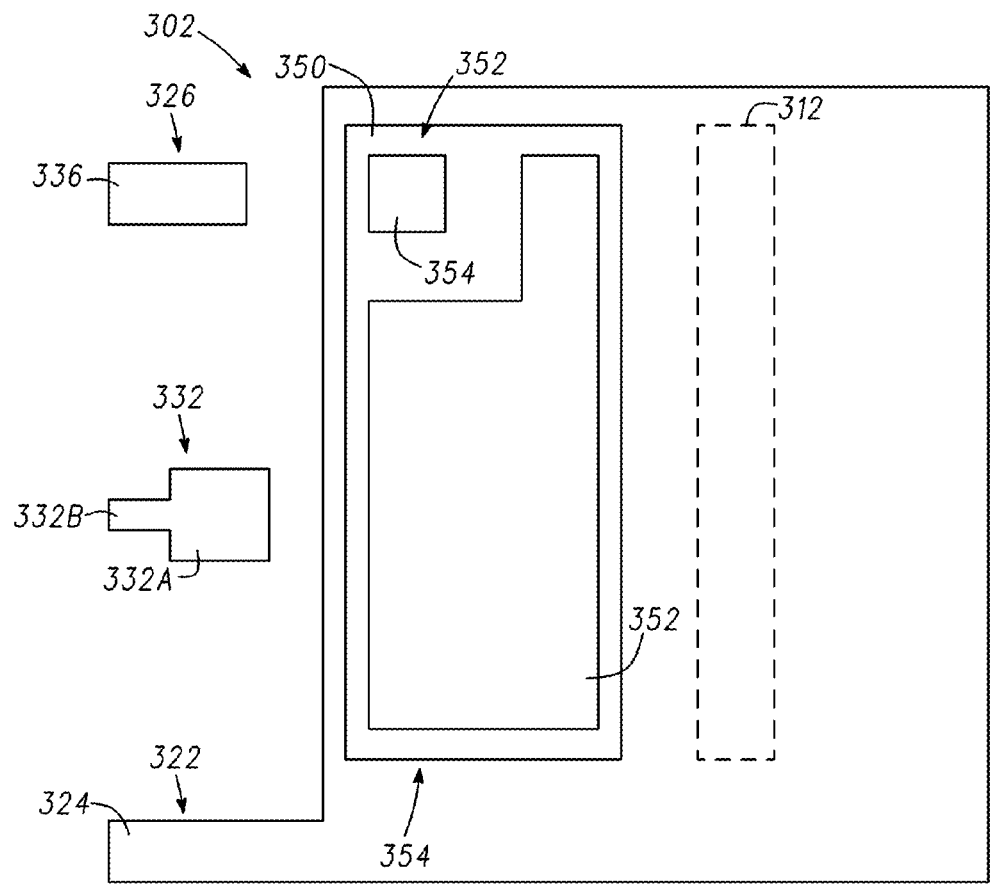
FIG. 40 is a top view of a cascode configured semiconductor component in accordance with another embodiment of the present invention.
Figure 41:
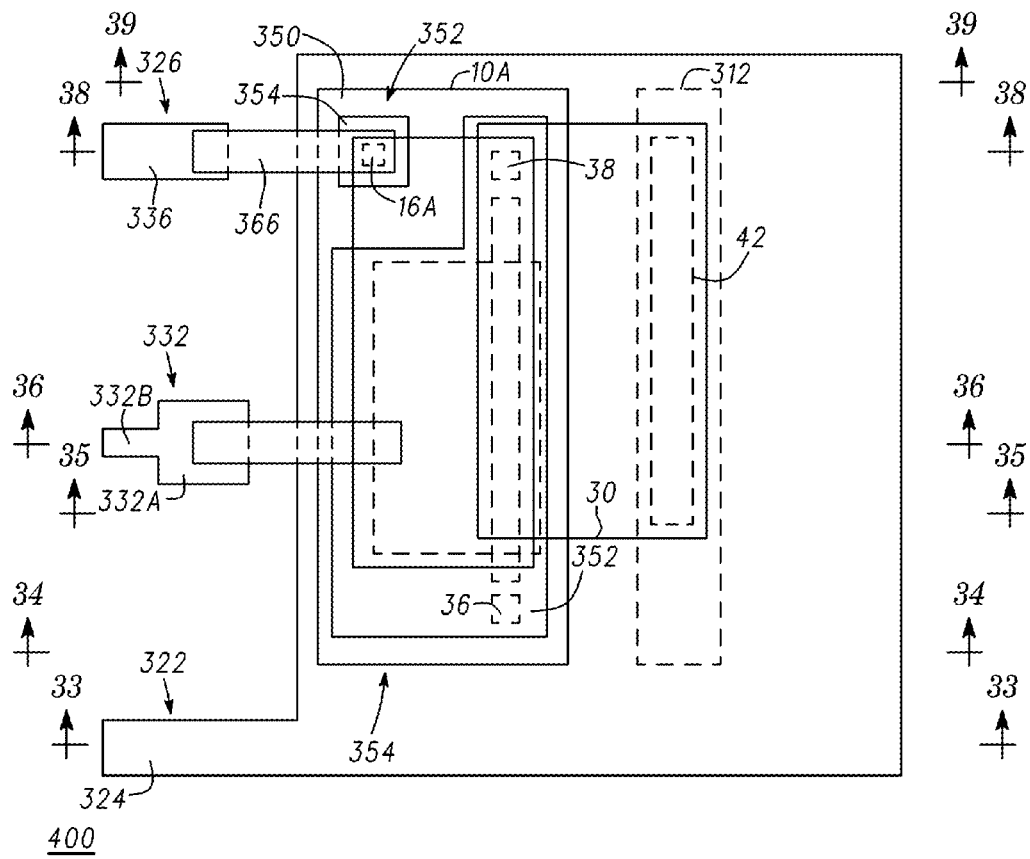
FIG. 41 is a top view of the cascode configured semiconductor component of FIG. 40 during manufacture in accordance with an embodiment of the present invention.
Figure 42:
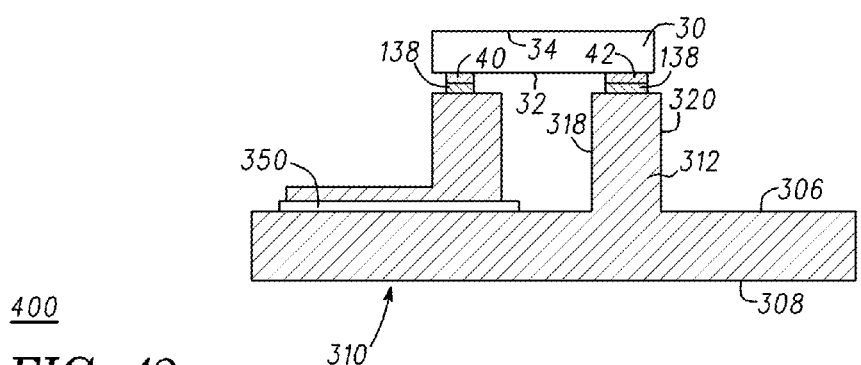
FIG. 42 is a cross-sectional view of the cascode configured semiconductor component of FIG. 41 taken along section line 42-42 of FIG. 41.

FIG. 40 is a top view of a semiconductor component 400 comprising a support 302 to which a semiconductor chip 10A (shown in FIG. 2) and a semiconductor chip 30 are mounted. FIG. 41 is a top view of semiconductor component 400 further along during manufacture. FIG. 42 is a cross-sectional view of semiconductor component 400 taken along section line 42-42 of FIG. 41. For the sake of clarity, FIGS. 40-42 are described together. Semiconductor component 400 is similar to semiconductor component 300 except that interconnects 328 and 330, Kelvin lead 338, sense lead 340, and clip 364 are absent from semiconductor component 400. It should be appreciated that the cross-sectional views indicated by section lines 33-33, 34-34, 36-36, 38-38, and 39-39 shown in FIG. 41 may look the same as the cross-sectional views indicated by section lines 33-33, 34-34, 36-36, 38-38, and 39-39 shown in FIG. 32. Thus, FIGS. 33, 34, 36, 38, and 39 are representative cross-sectional views in FIGS. 32 and 41. Support 302 is configured to be packaged through hole package such as, for example, a TO-220 package, a TO-247 package, a TO-264 package, a TO-257 package, or the like.

Figures 43, 44:
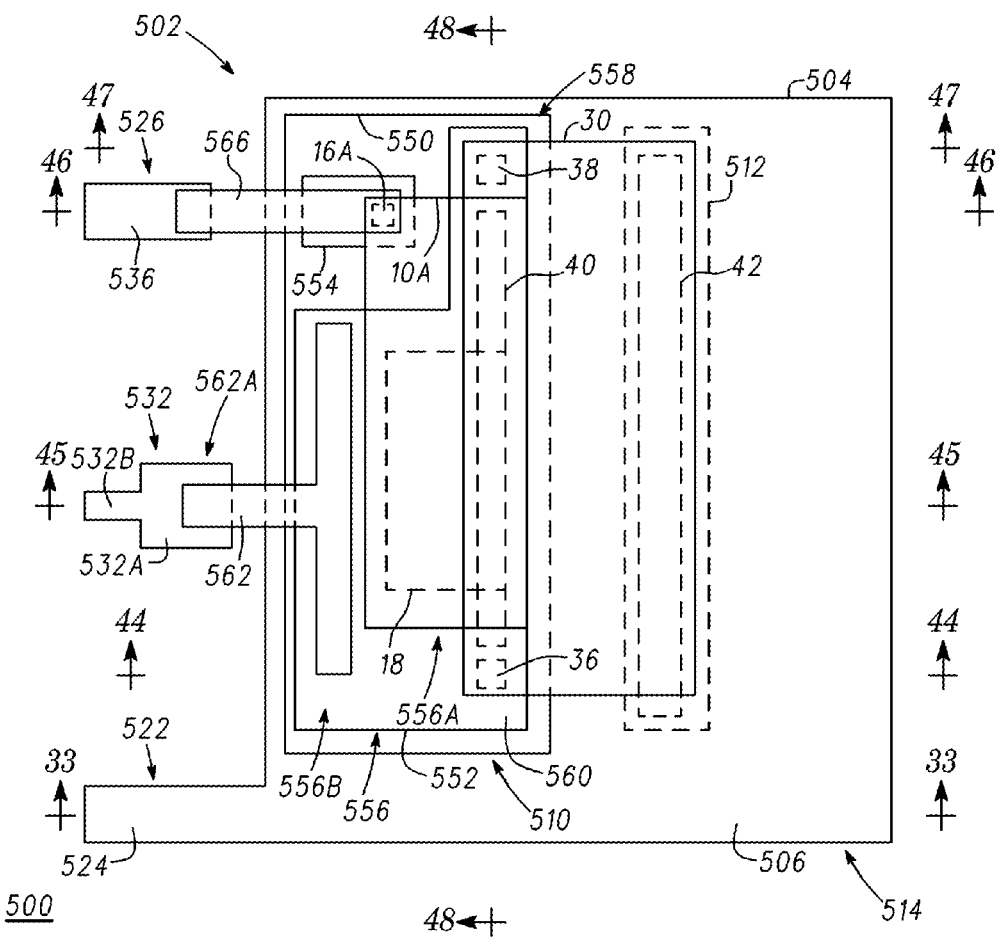
FIG. 43 is a top view of the cascode configured semiconductor component during manufacture in accordance with another embodiment of the present invention.
FIG. 44 is a cross-sectional view of the cascode configured semiconductor component of FIG. 43 taken along section line 44-44 of FIG. 43.
Figure 45:
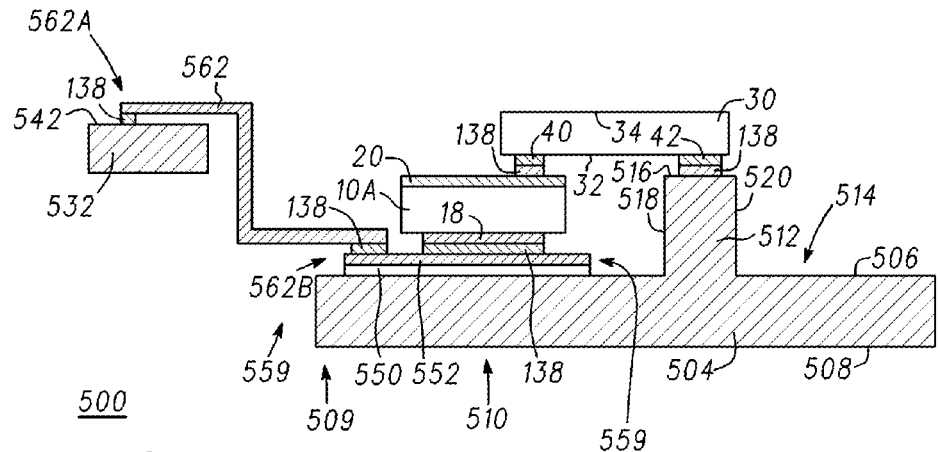
FIG. 45 is a cross-sectional view of the cascode configured semiconductor component of FIG. 43 taken along section line 45-45 of FIG. 43.
Figure 46:
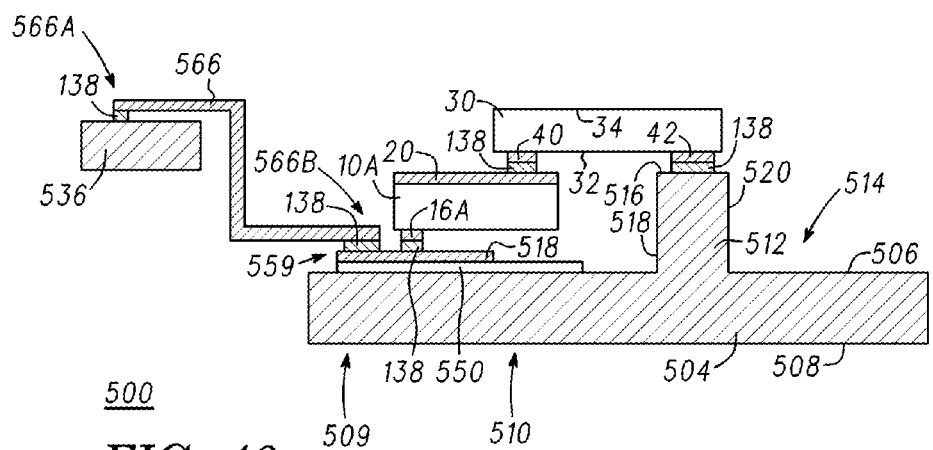
FIG. 46 is a cross-sectional view of the cascode configured semiconductor component of FIG. 43 taken along section line 46-46 of FIG. 43.
Figure 47:
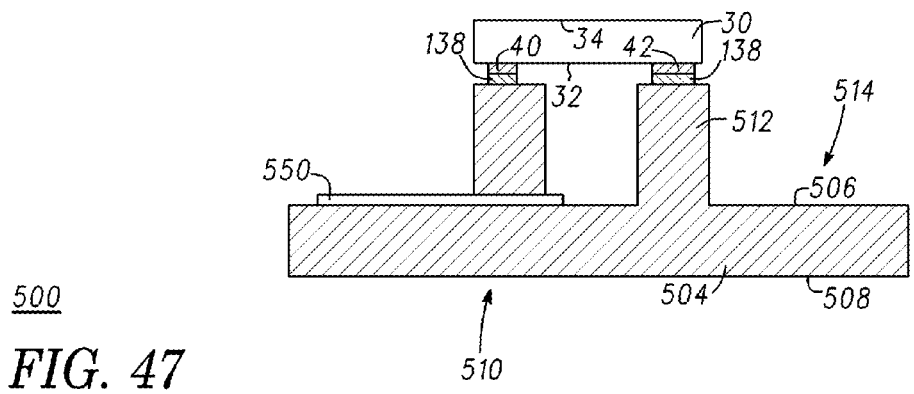
FIG. 47 is a cross-sectional view of the cascode configured semiconductor component of FIG. 43 taken along section line 47-47 of FIG. 43.
Figure 48:
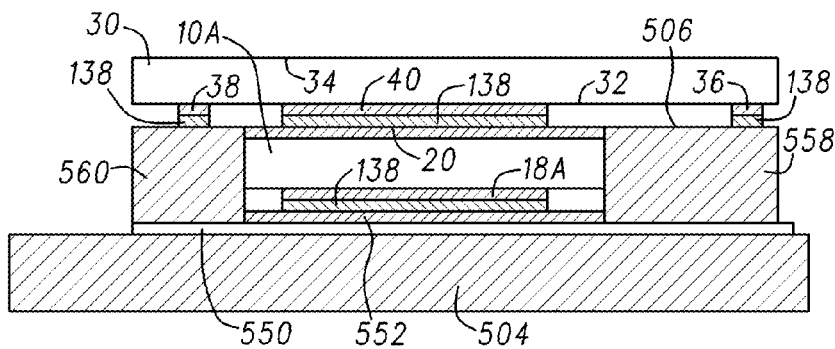
FIG. 48 is a cross-sectional view of the cascode configured semiconductor component of FIG. 43 taken along section line 48-48 of FIG. 43.

FIG. 43 is a top view of a semiconductor component 500 comprising a support 502 to which a semiconductor chip 10A (shown in FIG. 2) and a semiconductor chip 30 are mounted. FIG. 44 is a cross-sectional view of semiconductor component 500 taken along section line 44-44 of FIG. 43; FIG. 45 is a cross-sectional view of semiconductor component 500 taken along section line 45-45 of FIG. 43; FIG. 46 is a cross-sectional view of semiconductor component 500 taken along section line 46-46 of FIG. 43; FIG. 47 is a cross-sectional view of semiconductor component 500 taken along section line 47-47 of FIG. 32; and FIG. 48 is a cross-sectional view of semiconductor component 500 taken along section line 48-48 of FIG. 43. It should be appreciated that the cross-sectional view indicated by section line 33-33 shown in FIG. 43 looks the same as the cross-sectional view indicated by section lines 33-33 shown in FIG. 32. Thus, FIG. 33 is a representative cross-sectional view taken along section line 33-33 of FIGS. 43 and 41, where the reference characters may be adjusted to account for the numbering of the different embodiments. For the sake of clarity, FIGS. 43-48 are described together. Support 502 is comprised of an electrically conductive substrate 504 having major surfaces 506 and 508 and includes an interconnect area 509, a device receiving area 510, a pedestal 512, and an extension 514. Support 502 is configured to be packaged in a through hole package such as, for example, a TO-220 package, a TO-247 package, a TO-264 package, a TO-257 package, or the like. In accordance with an embodiment, electrically conductive substrate 504 has a rectangular shape having four corner regions. Pedestal 512 laterally separates device receiving area 510 from extension 514, i.e., pedestal 512 is between device receiving area 510 and extension 514. Pedestal 512 extends upward from surface 506 and has a surface 516 and sidewalls 518 and 520. In accordance with an embodiment, electrically conductive substrate 504 is copper. Other suitable materials for electrically conductive substrate 504 include aluminum, metal, or the like.

An electrical extension 522 extends from a corner region of electrically conductive substrate 504, wherein a portion 524 of extension 522 serves as a drain lead. Semiconductor component 500 further includes a rectangularly shaped interconnect 526 that is electrically isolated from electrically conductive substrate 504, and an interconnect 532 that is electrically isolated from electrically conductive substrate 504. By way of example, interconnect 532 has a square shaped body region 532A and an extension 532B extending from square shaped body region 532A. A portion 536 of interconnect 526 serves as a gate lead and a portion of interconnect 532 serves as a source lead. Although interconnect 526 has been described as having a rectangular shape and interconnect 532 has been described as having a square shape with an extension, this is not a limitation of the present invention and interconnects 526 and 532 may have other shapes.

A layer of electrically insulating material 550 is formed on device receiving area 510. In accordance with an embodiment, electrically insulating layer 550 comprises a ceramic material. An electrically conductive material is formed on electrically insulating layer 550 and patterned to form a device receiving structure 552 and an interconnect structure 554. In accordance with an embodiment, device receiving structure 552 has a rectangularly shaped portion 556 having an extension 558 extending from one side and a contact region 560 formed at the opposite side from which extension 558 extends and interconnect structure 554 is a rectangularly shaped structure that serves as an interconnect structure for a gate electrode. Rectangularly shaped portion 556 has device receiving area 556A and a clip mating area 556B. Like contact region 560, extension 558 also serves as a contact region and may be referred to as a contact region 558. Electrically conductive substrate 504, electrically insulating layer 550, and electrically conductive material 552 form a direct bonded copper substrate 559.

A semiconductor chip 10A is mounted device receiving area 556A in a flip chip configuration. More particularly, a source bond pad 18 is bonded to device receiving area 556A via electrically conductive bonding agent 138 and gate bond pad 16A is bonded to a portion of interconnect structure 554 via bonding agent 138. The term mounted to can be referred to as being bonded to, being attached to or the like. Because semiconductor chip 10A is mounted in a flip-chip configuration, gate bond pad 16A and source bond pad 18 are hidden or blocked from view. Thus, gate bond pad 16A and source bond pad 18 are indicated by dashed lines or broken lines in FIG. 43.

A semiconductor chip 30 is attached to semiconductor chip 10A and to pedestal 512. More particularly, a bonding agent 138 is formed on drain contact 20 and a bonding agent 138 is formed on a portion of pedestal 512. A source bond pad 42 of III-N semiconductor chip 30 is bonded to drain contact 20 of semiconductor chip 10A through bonding agent 138 and a drain bond pad 42 of III-N semiconductor chip 30 is bonded to pedestal 512 through bonding agent 138. As described above, suitable materials for bonding agent 138 include solder, an electrically conductive die attach material, an electrically conductive mold compound, or the like.

Source lead 532 is electrically connected to clip mating area by an electrically conductive element 562 and gate lead 536 is electrically connected to interconnect structure 554 by an electrically conductive element 566. By way of example, electrically conductive elements 562 and 566 are clips. Clip 562 has an end 562A bonded to interconnect 532 by an electrically conductive bonding agent 138 and an end 562B bonded to clip mating area 556B by an electrically conductive bonding agent 138. Clip 566 has an end 566A bonded to interconnect 526 by an electrically conductive bonding agent 138 and an end 566B bonded to interconnect 554 by an electrically conductive bonding agent 138. Electrically conductive bonding agent 138 may be solder, an electrically conductive adhesive, an electrically conductive material, or the like.

As those skilled in the art are aware, support 502 and semiconductor chips 10A and 30 may be encapsulated in a protective material (not shown) such as, for example a mold compound. It should be noted that after encapsulation, gate lead 536, source lead 536, and drain lead 524 extend from the mold compound. In accordance with an embodiment, the mold compound is a thermally enhanced mold compound.

In accordance with this embodiment, the III-N substrate or III-N semiconductor material of semiconductor chip 30 is floating, i.e., the III-N substrate is not connected to an electrical potential or a fixed potential. Although semiconductor component 500 is shown as having bond pads not formed over active areas of semiconductor chips 10A and 30, this is not a limitation. Bond pads may be formed over active areas of semiconductor chip 10A, semiconductor chip 30, or both, which lowers the cost of manufacture because additional area is not needed for bond pads. Forming the bond pads over active areas also increases the sizes of the bond pads which improves thermal performance because of an increased heat conduction, i.e., an increase in thermal conduction. In addition, heat conduction can be further increased by forming a thermally conductive material on or in contact with surface 34 of semiconductor chip 30.

Figure 49:
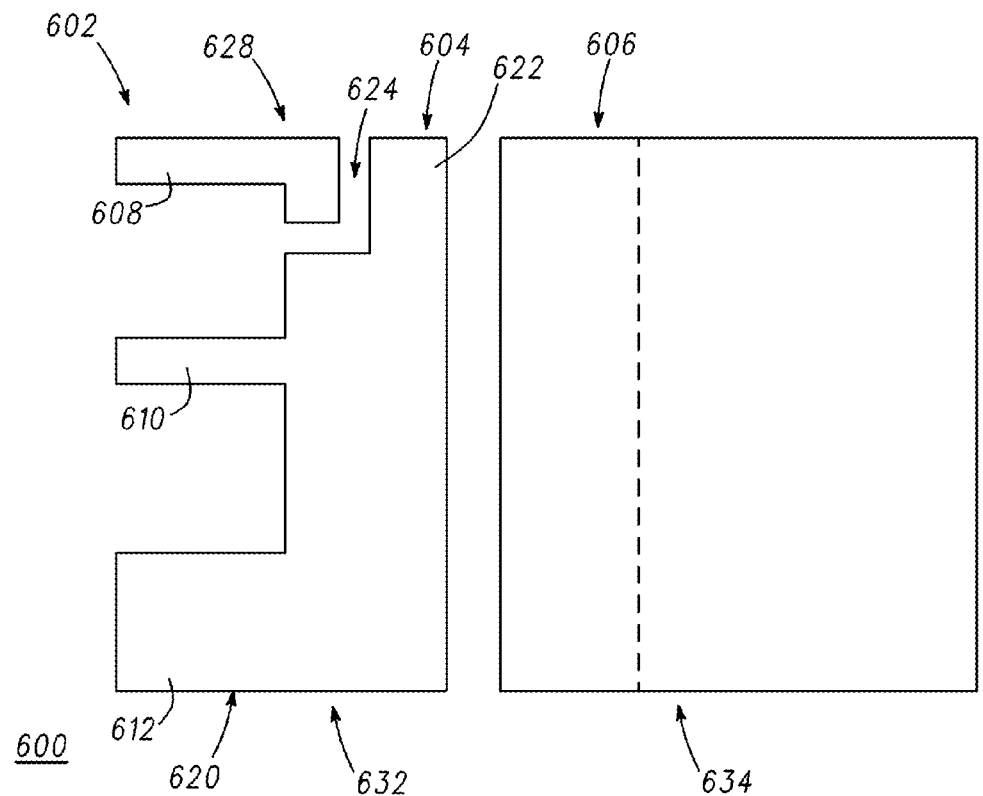
FIG. 49 is a top view of a cascode configured semiconductor component during manufacture in accordance with another embodiment of the present invention.
Figure 50:
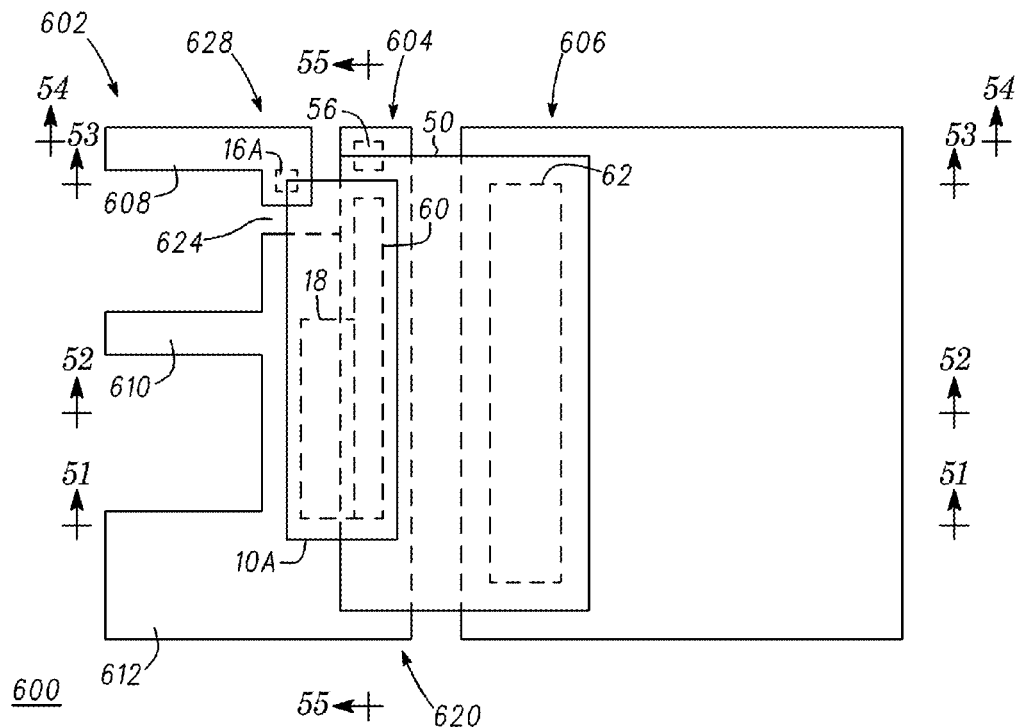
FIG. 50 is a top view of the cascode configured semiconductor component of FIG. 49 during manufacture in accordance with another embodiment of the present invention.
Figure 51:
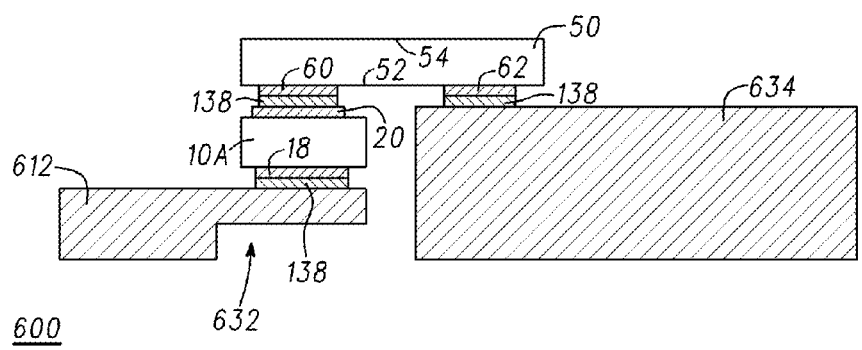
FIG. 51 is a cross-sectional view of the cascode configured semiconductor component of FIG. 50 taken along section line 51-51 of FIG. 50.
Figure 52:
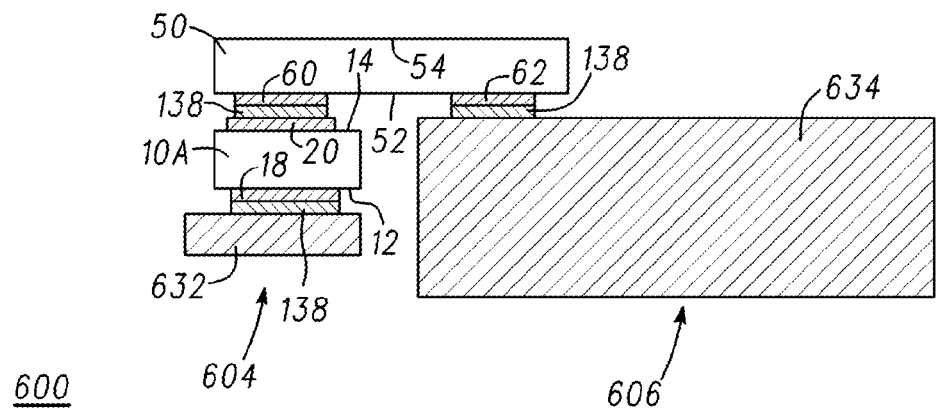
FIG. 52 is a cross-sectional view of the cascode configured semiconductor component of FIG. 50 taken along section line 52-52 of FIG. 50.
Figure 53:
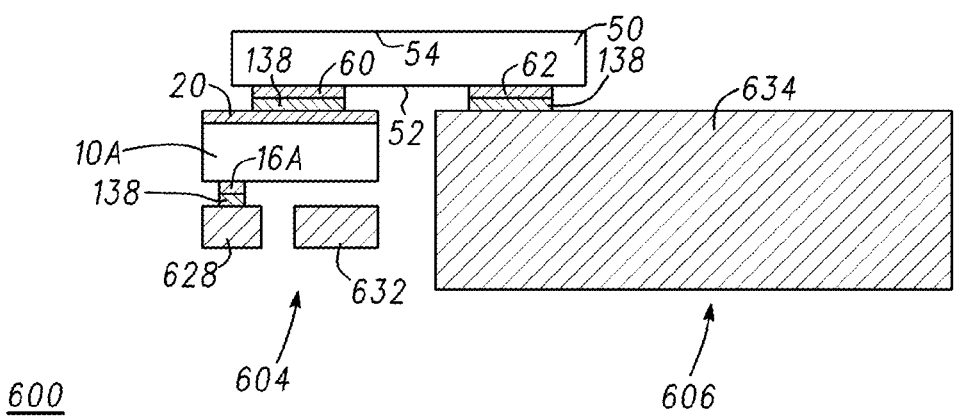
FIG. 53 is a cross-sectional view of the cascode configured semiconductor component of FIG. 50 taken along section line 53-53 of FIG. 50.
Figure 54:
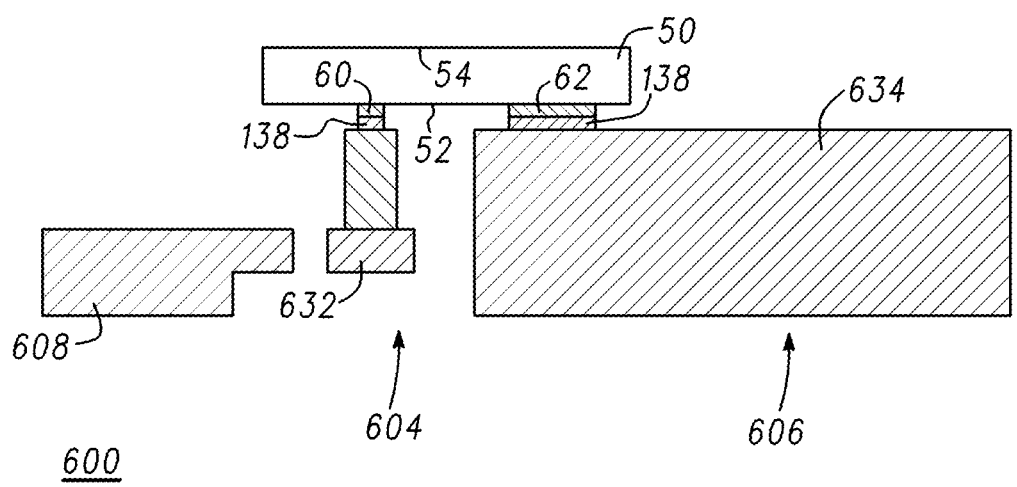
FIG. 54 is a cross-sectional view of the cascode configured semiconductor component of FIG. 50 taken along section line 54-54 of FIG. 50.
Figure 55:
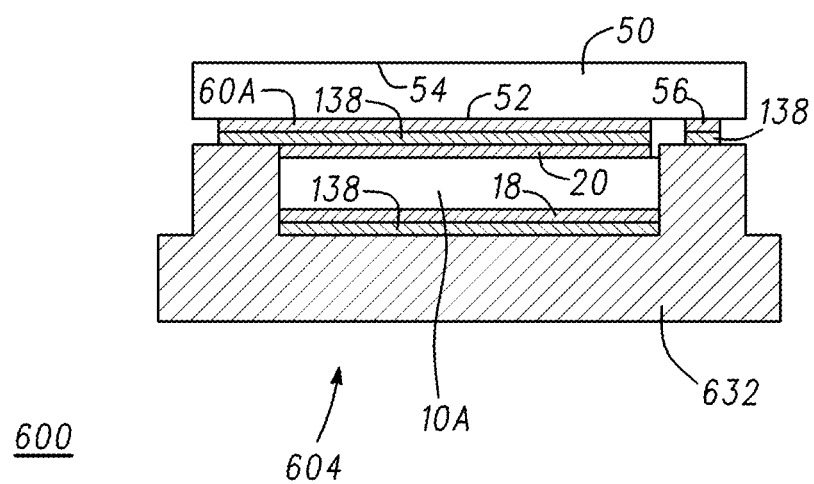
FIG. 55 is a cross-sectional view of the cascode configured semiconductor component of FIG. 50 taken along section line 55-55 of FIG. 50.

FIG. 49 is a top view of a support 602 configured for use in manufacturing a semiconductor component 600 in accordance with an embodiment of the present invention. Semiconductor component 600 comprises support 602 having semiconductor chips 10A and 50 mounted thereto. FIG. 50 is a top view of semiconductor component 600 to which a semiconductor chip 10A and a semiconductor chip 50 are mounted further along in manufacture. FIG. 51 is a cross-sectional view of semiconductor component 600 taken along section line 51-51 of FIG. 50; FIG. 52 is a cross-sectional view of semiconductor component 600 taken along section line 52-52 of FIG. 50; FIG. 53 is a cross-sectional view of semiconductor component 600 taken along section line 53-53 of FIG. 50; FIG. 54 is a cross-sectional view of semiconductor component 600 taken along section line 54-54 of FIG. 50; and FIG. 55 is a cross-sectional view of semiconductor component 600 taken along section line 55-55 of FIG. 50. For the sake of clarity, FIGS. 49-55 are described together. Support 602 includes device receiving structures 604 and 606, a gate lead 608, a Kelvin lead 610, a source lead 612, and is configured for packaging in a QFN package. Device receiving structure 604 includes a rectangularly shaped portion 620 having a tab 622 extending from a side of rectangularly shaped portion 620 to form a notch 624. A contact interconnect 628 having an L-shape is formed in notch 624, wherein contact interconnect 628 is electrically isolated from rectangularly shaped portion 620 and tab 622. In accordance with an embodiment contact interconnect 628 has a leg portion and a foot portion that may be at right angles to each other. The foot portion is configured to mate with a gate bond pad 16A and the leg portion has an end region that serves as gate lead 608 or a gate post. Kelvin lead 610 has a rectangular shape and is integral with and extends from rectangularly shaped portion 620. Source lead 612 is a rectangularly shaped electrically conductive material having a portion that is integral with and extends from a corner region of rectangularly shaped portion 620. Device receiving structure 606 includes a body of electrically conductive material 636 that is spaced apart and electrically isolated from rectangularly shaped portion 620 and tab 622. Although leads 608, 610, and 612 have been described as L-shaped or rectangularly shaped, these are not limitations of the present invention, i.e., leads 608, 610, and 612 may have other shapes.

In accordance with an embodiment, support 602 is an electrically conductive support structure configured to have device receiving structure 604 and device receiving structure 606. More particularly, support 602 may be manufactured from an electrically conductive material such as, for example, copper and configured to have a mating portion 632 and a mating portion 634. Support 602 can be made from a single piece of electrically conductive material such as, for example, a single piece of copper. Mating portion 632 may be referred to as a silicon support portion or silicon support structure and mating portion 634 may be referred to as a pedestal portion, a drain interconnect, a drain electrode, or a drain contact. In accordance with an embodiment, a portion of pedestal portion 634 is thicker than silicon support portion 632, hence it may be described as a pedestal portion.

Semiconductor chip 10A is mounted to device support 602 in a flip-chip configuration. As discussed with reference to FIG. 2, semiconductor chip 10A has a gate bond pad 16A formed on or from its top surface 12, a source bond pad 18 formed on or from top surface 12, and a drain contact 20 formed on or from a bottom surface 14 (shown in FIG. 52). The term mounted to can be referred to as being bonded to, being attached to or the like. Because semiconductor chip 10A is mounted in a flip-chip configuration, gate bond pad 16A and source bond pad 18 are hidden or blocked from view. Thus, gate bond pad 16A and source bond pad 18 are indicated by dashed lines or broken lines. Accordingly, source bond pad 18A of semiconductor chip 10A is attached to silicon support 632 and gate bond pad 16A of semiconductor chip 10A is attached to the foot portion of contact interconnect 628. More particularly, source bond pad 18A is bonded to silicon support using a bonding agent 138 and gate bond pad 16A is bonded to the foot portion of contact interconnect 628 using a bonding agent 138. Suitable materials for bonding agent 138 include solder, an electrically conductive epoxy, an electrically conductive adhesive, or the like.

A semiconductor chip 50 is attached to semiconductor chip 10A and to pedestal portion 634. More particularly, a bonding agent 138 is formed on drain contact 20 and a bonding agent 138 is formed on a portion of pedestal portion 634. A source bond pad 62 of III-N semiconductor chip 50 is bonded to drain contact 20 of semiconductor chip 10A through bonding agent 138 and a drain bond pad 62 of III-N semiconductor chip 50 is bonded to pedestal portion 634 through bonding agent 138.

As those skilled in the art are aware, support 602 including device receiving structures 604 and 606 and semiconductor chips 10A and 50 may be encapsulated in a protective material (not shown) such as, for example a mold compound. It should be noted that after encapsulation, gate lead 608, Kelvin lead 610, and source lead 612 extend from the mold compound. In accordance with an embodiment, the mold compound is a thermally enhanced mold compound.

In accordance with this embodiment, the III-N substrate or III-N semiconductor material of semiconductor chip 30 is floating, i.e., the III-N substrate is not connected to an electrical potential or a fixed potential. Although semiconductor component 600 is shown as having bond pads not formed over active areas of semiconductor chips 10A and 50, this is not a limitation. Bond pads may be formed over active areas of semiconductor chip 10A, semiconductor chip 50, or both, which lowers the cost of manufacture because additional area is not needed for bond pads. Forming the bond pads over active areas also increases the sizes of the bond pads which improves thermal performance because of an increased heat conduction. In addition, heat conduction can be further increased by forming a thermally conductive material on or in contact with surface 52 of semiconductor chip 50.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component, comprising:
a support having a first device receiving structure, a second device receiving structure, and a first lead;
a first semiconductor chip having a first surface and a second surface, wherein a first gate bond pad extends from a first portion of the first surface, a source bond pad extends from a second portion of the first surface, and a drain contact is at the second surface, the gate bond pad of the first semiconductor chip coupled to the first lead and the source bond pad of the first semiconductor chip coupled to the first device receiving structure, the first semiconductor chip configured from a silicon semiconductor material and coupled to the support in a flip-chip configuration; and
a second semiconductor chip having a first surface and a second surface, a gate bond pad of the second semiconductor chip extends from a first portion of the first surface of the second semiconductor chip, a source bond pad of the second semiconductor chip extends from a second portion of the first surface of the second semiconductor chip, and a drain bond pad extends from a third portion of the first surface of the second semiconductor chip, the source bond pad of the second semiconductor chip coupled to the second surface of the first semiconductor chip, the gate bond pad of the second semiconductor chip coupled to the first device receiving structure, and the drain bond pad of the second semiconductor chip coupled to the second device receiving structure, the second semiconductor chip configured from a III-nitride semiconductor material and coupled to the support in a flip-chip configuration.

2. The semiconductor component of claim 1, further including a first electrical interconnect electrically coupling the drain contact of the first semiconductor chip and the second surface of the second semiconductor chip.

3. The semiconductor component of claim 1, wherein the first electrical interconnect is a clip.

4. The semiconductor component of claim 1, further including:
a second lead extending from the first device receiving structure; and
a third lead extending from the first device receiving structure.

5. The semiconductor component of claim 1, wherein the second device receiving structure comprises a pedestal portion and the first device receiving structure comprises a mating portion, the pedestal portion thicker than the mating portion.

6. The semiconductor component of claim 1, further including a second lead, the second lead extending from the second device receiving structure.

7. The semiconductor component of claim 6, further including:
a second lead extending from the first device receiving structure; and
a third lead extending from the first device receiving structure.

8. A semiconductor component, comprising:
a support having a first device receiving structure, a second device receiving structure, and a first lead, the first lead extending from the second device receiving structure;
a first semiconductor chip bonded to the first device receiving structure, the first semiconductor chip having a first surface and a second surface, wherein a cathode is formed from a first portion of the first surface and an anode is formed from a first portion of the second surface, the first semiconductor chip configured from a silicon semiconductor material; and
a second semiconductor chip having a first surface and a second surface, a gate bond pad of the second semiconductor chip extends from a first portion of the first surface of the second semiconductor chip, a source bond pad of the second semiconductor chip extends from a second portion of the first surface of the second semiconductor chip, and a drain bond pad extends from a third portion of the first surface of the second semiconductor chip, the source bond pad of the second semiconductor chip coupled to the cathode of the first semiconductor chip, the gate bond pad of the second semiconductor chip coupled to the first device receiving structure, and the drain bond pad of the second semiconductor chip coupled to the second device receiving structure, the second semiconductor chip configured from a III-nitride semiconductor material and coupled to the support in a flip-chip configuration.

9. The semiconductor component of claim 8, wherein the second device receiving structure comprises a body of electrically conductive material that is spaced apart and electrically isolated from the first device receiving structure, and wherein the first lead extends from the body of electrically conductive material.

10. The semiconductor component of claim 9, wherein the first device receiving structure comprises a rectangularly shaped portion having a second lead extending therefrom.

11. The semiconductor component of claim 10, wherein a sum of a thickness of the second lead and the first semiconductor chip substantially equals a thickness of the body of electrically conductive material.

12. The semiconductor component of claim 11, further including a first bonding agent between the anode and the first device receiving structure, a second bonding agent between the cathode and the source bond pad, and a third bonding agent between the drain bond pad and the body of electrically conductive material.

13. The semiconductor component of claim 12, wherein the first bonding agent, the second bonding agent, and the third bonding agent are the same material.

14. A semiconductor component, comprising:
a support having an interconnect area, a device receiving area, and an electrically conductive substrate;
an insulating material formed on the device receiving area;
a first electrically conductive layer formed on a first portion of the insulating material;
a second electrically conductive layer formed on a second portion of the insulating material;
a first lead adjacent to and electrically isolated from the first electrically conductive layer;
a second lead adjacent to and electrically isolated from the second electrically conductive layer;
a third lead extending from the electrically conductive substrate;
a first semiconductor chip having a first surface and a second surface, wherein a first gate bond pad extends from a first portion of the first surface, a source bond pad extends from a second portion of the first surface, and a drain contact is at the second surface, the gate bond pad of the first semiconductor chip coupled to the first electrically conductive layer and the source bond pad of the first semiconductor chip coupled to the second electrically conductive layer, the first semiconductor chip configured from a silicon semiconductor material and coupled to the support in a flip-chip configuration; and
a second semiconductor chip having a first surface and a second surface, a gate bond pad of the second semiconductor chip extends from a first portion of the first surface of the second semiconductor chip, a source bond pad of the second semiconductor chip extends from a second portion of the first surface of the second semiconductor chip, and a drain bond pad extends from a third portion of the first surface of the second semiconductor chip, the source bond pad of the second semiconductor chip coupled to the drain contact of the first semiconductor chip, the gate bond pad of the second semiconductor chip coupled to the second electrically conductive layer, and the drain bond pad of the second semiconductor chip coupled to the electrically conductive substrate, the second semiconductor chip configured from a III-nitride semiconductor material and coupled to the support in a flip-chip configuration.

15. The semiconductor component of claim 14, wherein the electrically conductive substrate has a rectangular shape and a pedestal extending from a portion of the electrically conductive substrate.

16. The semiconductor component of claim 15, further including:
   a first clip electrically coupling the first electrically conductive layer to the first lead; and
   a second clip electrically coupling the second electrically conductive layer to the second lead.

17. The semiconductor component of claim 16, wherein the second clip is bonded to the second electrically conductive layer through a bonding agent and the source bond pad of the first semiconductor chip is bonded to the second electrically conductive layer through another bonding agent.

18. The semiconductor component of claim 16, wherein the second clip is bonded to the second electrically conductive layer through a bonding agent and the source bond pad of the first semiconductor chip is bonded to the second clip through another bonding agent.

19. The semiconductor component of 18, further including:
   a fourth lead adjacent to and electrically isolated from the second electrically conductive layer;
   a fifth lead adjacent to and electrically isolated from the second electrically conductive layer;
   a bond wire coupled between the drain contact and the fifth lead; and
   a portion of the second clip coupled between the drain contact of the first semiconductor chip and the fourth lead.

20. The semiconductor component of 16, wherein the insulating material is a ceramic.

* * * * *